(12) United States Patent
Papandreou et al.

(10) Patent No.: US 11,086,705 B2
(45) Date of Patent: Aug. 10, 2021

(54) MANAGING THE RELIABILITY OF PAGES IN NON-VOLATILE RANDOM ACCESS MEMORY

(71) Applicant: International Business Machines Corporation, Armonk, NY (US)

(72) Inventors: Nikolaos Papandreou, Thalwil (CH); Roman A. Pletka, Uster (CH); Sasa Tomic, Kilchberg (CH); Nikolas Ioannou, Zurich (CH); Charalampos Pozidis, Thalwil (CH); Timothy J. Fisher, Cypress, TX (US); Aaron D. Fry, Richmond, TX (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 16/357,049

(22) Filed: Mar. 18, 2019

(65) Prior Publication Data

US 2020/0301768 A1 Sep. 24, 2020

(51) Int. Cl.
*G06F 11/00* (2006.01)
*G06F 11/07* (2006.01)
*G06F 3/06* (2006.01)

(52) U.S. Cl.
CPC ............ *G06F 11/076* (2013.01); *G06F 3/064* (2013.01); *G06F 3/0619* (2013.01);
(Continued)

(58) Field of Classification Search
CPC ...... G06F 11/076; G06F 3/064; G06F 3/0679; G06F 3/0619; G06F 3/0644; G06F 3/0689; G01R 31/3171; H03M 13/015
(Continued)

(56) References Cited

U.S. PATENT DOCUMENTS 8,908,436 B2 12/2014 Martinozzi et al.
8,929,143 B2 1/2015 Suzuki
(Continued)

OTHER PUBLICATIONS

Cichon et al., "Approximate Counters for Flash Memory," 17th IEEE International Conference on Embedded and Real-Time Computing Systems and Applications, 2011, pp. 185-189.
(Continued)

*Primary Examiner* — Albert Decady
*Assistant Examiner* — Osman M Alshack
(74) *Attorney, Agent, or Firm* — Zilka-Kotab, P.C.

(57) ABSTRACT

A computer-implemented method, according to one embodiment, includes: performing a first read of one or more pages in a first page region of a first block. In response to determining that the highest RBER experienced during the first read is not in a first predetermined range, a first calibration procedure is performed on the one or more pages. A second read of the one or more pages is performed. In response to determining that the highest RBER experienced during the second read is not in a second predetermined range, a second calibration procedure on the one or more pages is performed, and a third read of the one or more pages is performed. In response to determining that the highest RBER experienced during the third read is not in the second predetermined range, a reliability counter which corresponds to the first page region of the first block is incremented.

18 Claims, 19 Drawing Sheets

(52) U.S. Cl.
CPC .......... *G06F 3/0644* (2013.01); *G06F 3/0679* (2013.01); *G06F 3/0689* (2013.01)

(58) Field of Classification Search
USPC ......................................... 714/703, 704, 721
See application file for complete search history.

(56) References Cited

U.S. PATENT DOCUMENTS

| | | | |
|---|---|---|---|
| 9,159,423 B1 | 10/2015 | Brahmadathan et al. | |
| 9,274,882 B2 | 3/2016 | Camp et al. | |
| 9,292,377 B2 | 3/2016 | Alhussien et al. | |
| 9,761,308 B1* | 9/2017 | Cometti | G11C 16/26 |
| 9,870,316 B2 | 1/2018 | Van Keer et al. | |
| 9,952,795 B2 | 4/2018 | Camp et al. | |
| 10,170,195 B1* | 1/2019 | Ioannou | G11C 29/00 |
| 10,395,754 B2* | 8/2019 | Maffeis | G06F 11/1012 |
| 2014/0059406 A1* | 2/2014 | Hyun | G11C 11/5621 |
| | | | 714/773 |
| 2014/0082457 A1 | 3/2014 | Kitahara et al. | |
| 2014/0153330 A1* | 6/2014 | Yoon | G11C 16/0483 |
| | | | 365/185.03 |
| 2015/0049547 A1* | 2/2015 | Kim | G11C 29/028 |
| | | | 365/185.09 |
| 2016/0027521 A1 | 1/2016 | Lu | |
| 2016/0034206 A1* | 2/2016 | Ryan | G06F 12/0246 |
| | | | 711/103 |
| 2016/0041891 A1* | 2/2016 | Malshe | G06F 11/1048 |
| | | | 714/704 |
| 2016/0110124 A1* | 4/2016 | Camp | G06F 11/076 |
| | | | 714/704 |
| 2016/0110248 A1* | 4/2016 | Camp | G06F 3/0652 |
| | | | 714/54 |
| 2016/0300609 A1 | 10/2016 | Han et al. | |
| 2017/0262336 A1 | 9/2017 | Tabrizi et al. | |
| 2017/0337104 A1 | 11/2017 | Dawirs et al. | |
| 2017/0364298 A1* | 12/2017 | Choi | G11C 16/349 |
| 2018/0129452 A1 | 5/2018 | Li | |
| 2019/0103164 A1* | 4/2019 | Malshe | G06F 11/22 |
| 2020/0066361 A1* | 2/2020 | Ioannou | G11C 16/26 |

OTHER PUBLICATIONS

Li et al., "A page lifetime-aware scrubbing scheme for improving reliability of Flash-based SSD," IEICE Electronics Express, 2017, pp. 1-12.
Wei et al., "A page-granularity wear-leveling (PGWL) strategy for NAND flash memory-based sink nodes in wireless sensor networks," Journal of Network and Computer Applications, vol. 63, 2016, pp. 125-139.
Cai et al., "Errors in Flash-Memory-Based Solid-State Drives: Analysis, Mitigation, and Recovery," arXiv, Jan. 5, 2018, pp. 1-86.
Tomic et al., U.S. Appl. No. 16/206,707, filed Nov. 30, 2018.
U.S. Appl. No. 16/111,804, filed Aug. 24, 2018.
U.S. Appl. No. 16/109,689, filed Aug. 22, 2018.
U.S. Appl. No. 16/014,909, filed Jun. 21, 2018.
U.S. Appl. No. 16/112,157, filed Aug. 24, 2018.

* cited by examiner

MANAGING THE RELIABILITY OF PAGES IN NON-VOLATILE RANDOM ACCESS MEMORY

BACKGROUND

The present invention relates to data storage systems, and more particularly, this invention relates to managing the reliability of pages of storage space in non-volatile random access memory (NVRAM).

NVRAM is a type of random-access memory which retains information stored thereon even after the power supply is turned off, and includes a number of different forms. Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program/erase (P/E) cycling, charge leakage from retention, and additional charge placed in the cells by read operations (i.e., read disturb errors). Typically, a Flash memory block is retired when any page in the block exhibits a code word that reaches a page retirement error count limit. This limit is typically set to be achieved in conjunction with an appropriate error correction code (ECC), resulting in the Uncorrectable Bit Error Rate (UBER) after applying the ECC for a Flash memory block being set to be similar to the UBER in traditional hard disk drives, e.g., at around $10^{-15}$, but may be more or less.

Read voltage shifting, also known as block calibration, has been shown to be a key contributor to enhance endurance and retention, particularly for enterprise-level Flash memory systems using modern three-dimensional (3-D) triple-level-cell (TLC) or quad-level-cell (QLC) NAND Flash memory. Previous attempts to maintain efficient memory performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects. Moreover, upon identifying a block which was a calibration candidate, these previous attempts would perform block-level calibrations in which all, or a selected subset of, pages in the identified block would be calibrated. It follows that these previous attempts involved inspecting each block of memory individually. Furthermore, although a block of memory is identified as being a candidate for calibration, typically not all pages in the block benefit from the calibration. Further still, some blocks of memory thought to benefit from recalibration may actually be experiencing permanent errors which persist despite performing a calibration operation.

SUMMARY

A computer-implemented method, according to one embodiment, includes: performing a first read of one or more pages in a first page region of a first block of storage space in memory. A determination is made as to whether a highest raw bit error rate (RBER) experienced during the first read is in a first predetermined range. In response to determining that the highest RBER experienced during the first read is not in the first predetermined range, a first calibration procedure is performed on the one or more pages in the first page region of the first block. A second read of the one or more pages in the first page region of the first block that were calibrated using the first calibration procedure is performed, and a determination as to whether a highest RBER experienced during the second read is in a second predetermined range is also performed. In response to determining that the highest RBER experienced during the second read is not in the second predetermined range, a second calibration procedure on the one or more pages in the first page region of the first block is performed. Further still, a third read of the one or more pages in the first page region of the first block that were calibrated using the second calibration procedure is performed. A determination is made as to whether a highest RBER experienced during the third read is in a third predetermined range, and in response to determining that the highest RBER experienced during the third read is not in the second predetermined range, a reliability counter which corresponds to the first page region of the first block is incremented.

A computer program product, according to another embodiment, includes a computer readable storage medium having program instructions embodied therewith. The program instructions are readable and/or executable by a processor to cause the processor to: perform the foregoing method.

A system, according to yet another embodiment, includes: a processor, and logic integrated with and/or executable by the processor. The logic is configured to: perform the foregoing method.

Other aspects and embodiments of the present invention will become apparent from the following detailed description, which, when taken in conjunction with the drawings, illustrate by way of example the principles of the invention.

DETAILED DESCRIPTION

Figure 1:
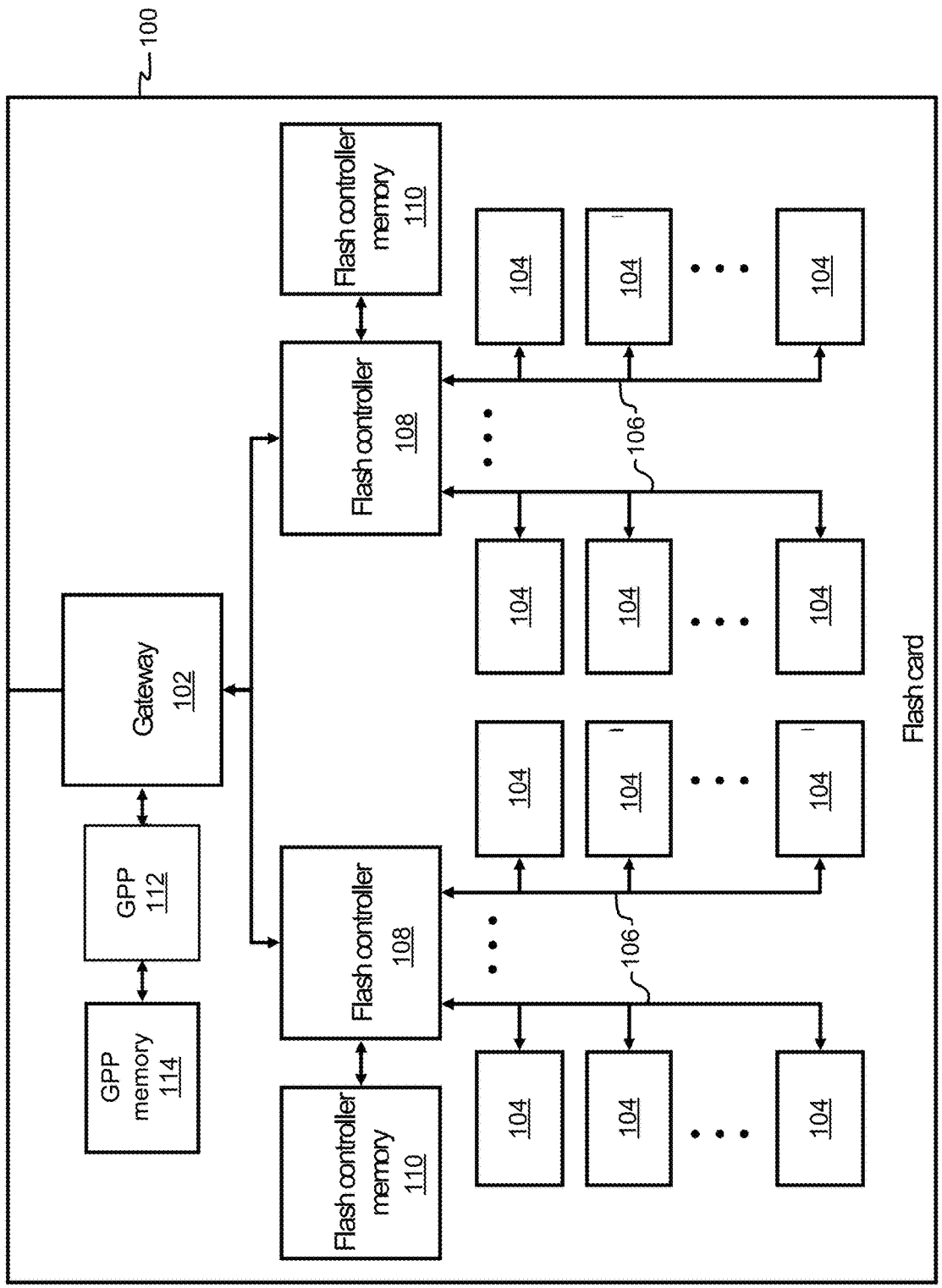
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof. It should be appreciated that various embodiments herein can be implemented with a wide range of memory mediums, including for example NVRAM technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a computer-implemented method includes: performing a first read of one or more pages in a first page region of a first block of storage space in memory. A determination is made as to whether a highest raw bit error rate (RBER) experienced during the first read is in a first predetermined range. In response to determining that the highest RBER experienced during the first read is not in the first predetermined range, a first calibration procedure is performed on the one or more pages in the first page region of the first block. A second read of the one or more pages in the first page region of the first block that were calibrated using the first calibration procedure is performed, and a determination as to whether a highest RBER experienced during the second read is in a second predetermined range is also performed. In response to determining that the highest RBER experienced during the second read is not in the second predetermined range, a second calibration procedure on the one or more pages in the first page region of the first block is performed. Further still, a third read of the one or more pages in the first page region of the first block that were calibrated using the second calibration procedure is performed. A determination is made as to whether a highest RBER experienced during the third read is in a third predetermined range, and in response to determining that the highest RBER experienced during the third read is not in the second predetermined range, a reliability counter which corresponds to the first page region of the first block is incremented.

In another general embodiment, a computer program product includes a computer readable storage medium having program instructions embodied therewith. The program instructions are readable and/or executable by a processor to cause the processor to: perform the foregoing method.

In another general embodiment, a system includes: a processor, and logic integrated with and/or executable by the processor. The logic is configured to: perform the foregoing method.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
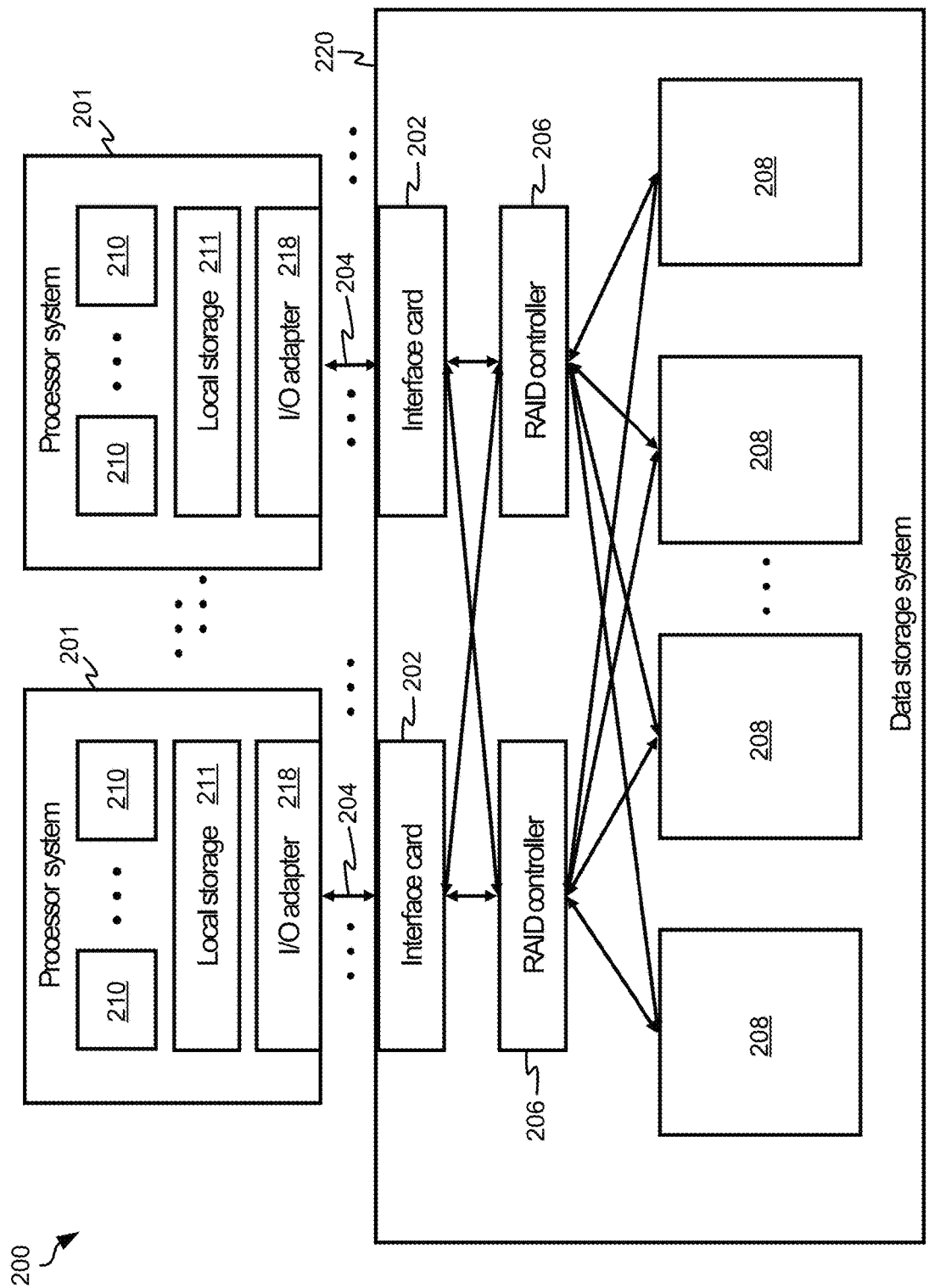
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via I/O interconnections 204 to one or more processor systems 201. The data storage system 220 may also comprise one or more Redundant Array of Independent Disks (RAID) controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-6, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1314 of FIG. 13, ROM 1316 of FIG. 13, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logic erase blocks (LEBs) may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or Flash channels are grouped together, such that blocks from the same group can be read or written in parallel, thereby increasing overall bandwidth. It is also possible to combine the previous two methods, and to compose RAID stripes using blocks from different Flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary embodiment, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the logical to physical table (LPT) mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, write heat segregation may be achieved. In particular, write heat segregating methods may group write hot memory pages together in certain memory blocks while write cold memory pages are grouped together in separate memory blocks. Thus, a write heat segregated LEB tends to be occupied by either write hot or cold data.

The merit of write heat segregation is two-fold. First, performing a garbage collection process on a write hot memory block will prevent triggering the relocation of write cold data as well. In the absence of heat segregation, updates to write hot data, which are performed frequently, also results in the undesirable relocations of all write cold data collocated on the same LEB as the hot data being relocated. Therefore, the write amplification incurred by performing garbage collection is much lower for embodiments implementing write heat segregation.

Secondly, the relative write heat of data can be utilized for wear leveling purposes. For example, write hot data may be placed in healthier (e.g., younger) memory blocks, while write cold data may be placed on less healthy (e.g., older) memory blocks relative to those healthier memory blocks. Thus, the rate at which relatively older blocks are exposed to wear is effectively slowed, thereby improving the overall endurance of a given data storage system implementing write heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Figure 3:
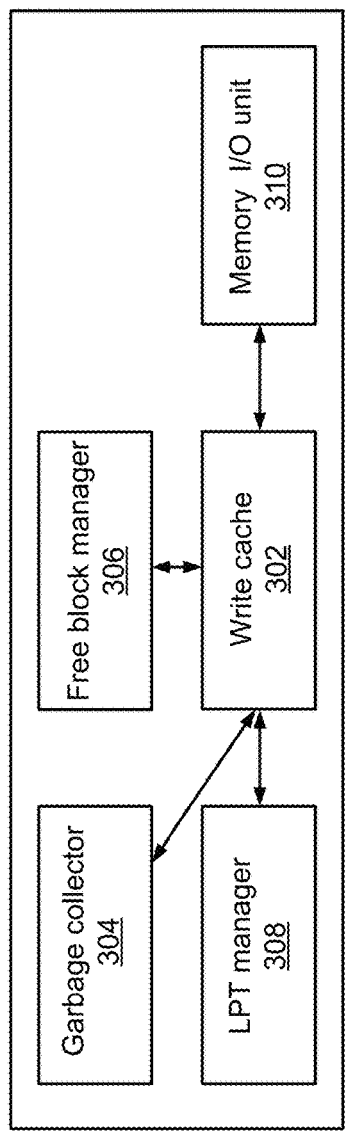
FIG. 3 is a system diagram, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages of memory. According to an example, which is in no way intended to limit the invention, the LPT manager 308 may maintain the logical-to-physical mappings of 4KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4A:
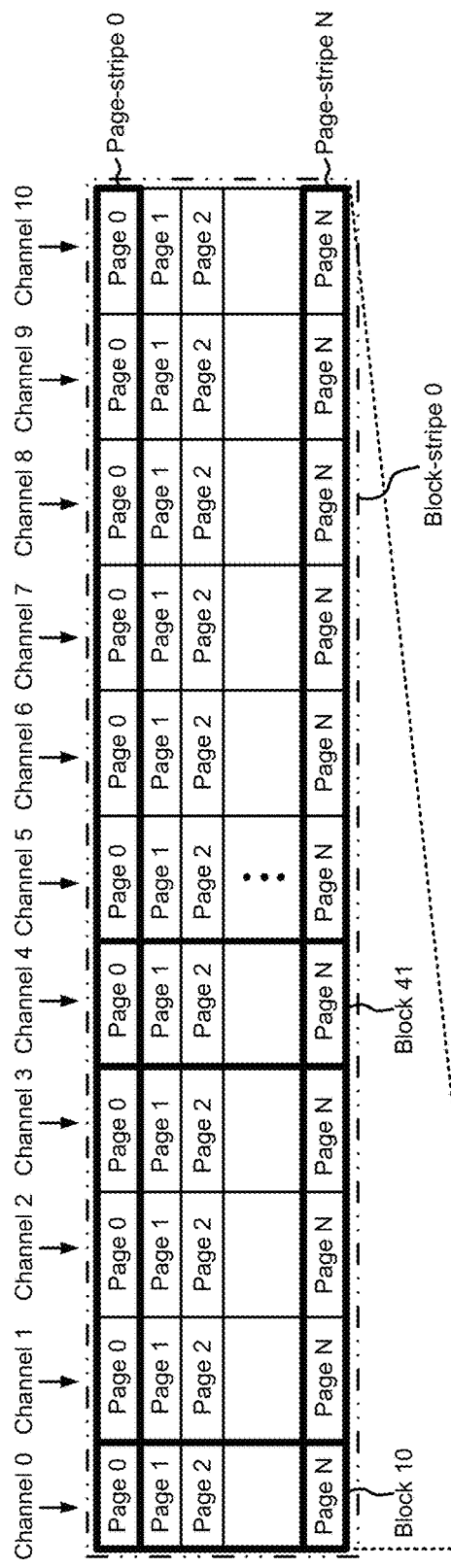
FIG. 4A is a conceptual diagram which includes a block-stripe and page-stripe, in accordance with one embodiment.

To better understand the distinction between block-stripes and page-stripes as used herein, FIG. 4A is a conceptual diagram 400, in accordance with one embodiment. LEBs are built from block stripes and typically a single block stripe is used to build a LEB. However, alternative embodiments may use multiple block stripes to form an LEB. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired embodiment, the conceptual diagram 400 of FIG. 4A may be implemented in defining the organization of data stored in non-volatile memory. Accordingly, both implementations are described in turn below.

Non-Volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given embodiment of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some embodiments one or more blocks of a block-stripe may belong to different physical planes. It follows that each aggregated plane may include one or more block-stripe. Thus, according to an illustrative embodiment, Block 0 through Block 10 from different physical planes may constitute a block-stripe.

Regardless of whether the conceptual diagram 400 of FIG. 4A is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 1024 pages, but could include more or less in various embodiments. Analogously, the number of channels per plane and/or the number of planes may vary depending on the desired embodiment.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4B:
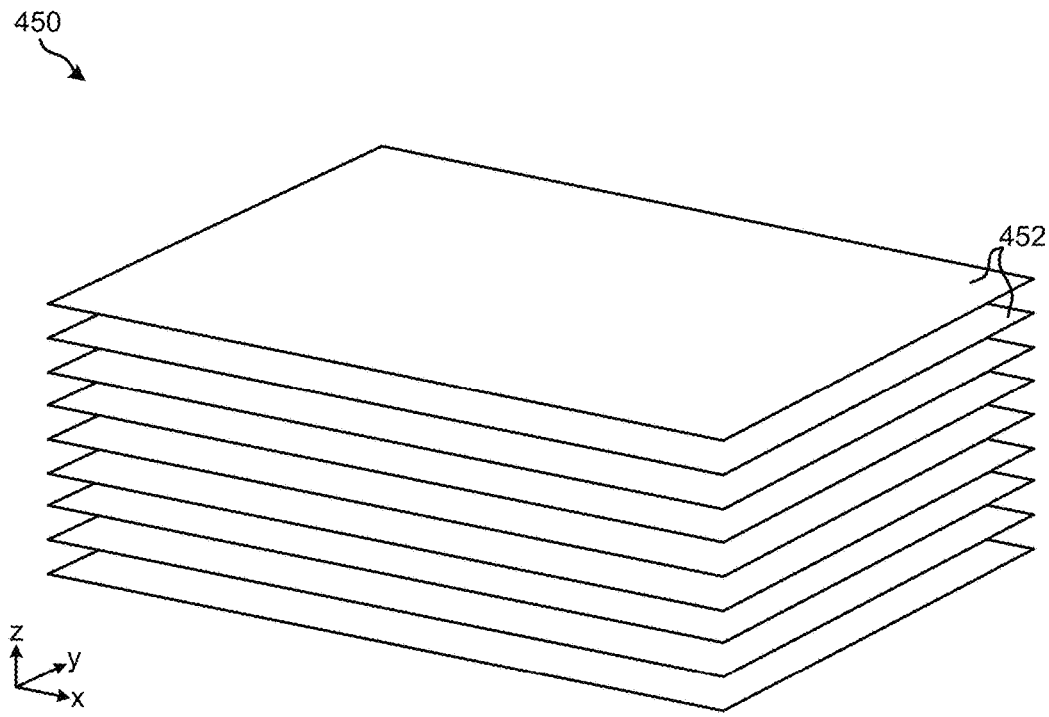
FIG. 4B is a partial perspective view of a 3-D non-volatile memory structure, in accordance with one embodiment.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one embodiment. As an option, the present structure 450 may be implemented in conjunction with features from any other embodiment listed herein, such as those described with reference to the other FIGS., such as FIG. 4A. However, such structure 450 and others presented herein may be used in various applications and/or in permutations which may or may not be specifically described in the illustrative embodiments listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency, e.g., by implementing shared wordlines. Cells from different bitlines along a wordline (typically in the x or y dimension of FIG. 4B) are logically combined to form pages: In TLC, each wordline in a block contains 3 physical pages (e.g., a lower page, an upper page, and an extra page) and a wordline typically belongs to one particular layer in the z dimension (perpendicular to the x-y plane). For a particular block, which is formed from a grid of cells connected by wordlines and bitlines, the number of wordlines residing on the same layer is typically small. Therefore, a block can be formed from wordlines of all layers 452. Moreover, wordlines as well as pages in the same block may reside on different layers 452.

Again, due to cycling, retention, read disturb, program disturb, etc., or other mechanisms that may be specific to the NAND storage technology (e.g., floating gate or charge trap), process technology (e.g., 2-D or 3-D), scaling node, etc., or other specific design factors, the programmed threshold voltage distributions in memory may change with writing and erasing data (cycling), reading data (read disturb), time (retention), etc., in a slow or fast manner. In other words, RBERs for Flash memory blocks increase with time and use. As memory blocks are used, each P/E cycle performed on the blocks causes damage, which in turn increases the corresponding RBER.

Although increases to RBERs are sometimes irreversible (e.g., such as those caused by prolonged P/E cycles), increases to RBERs caused by events such as retention and/or read disturbances are not permanent in the sense that the memory blocks affected are not irreversibly damaged. Rather, this unfavorable decline in performance is remedied when the corresponding memory blocks are erased and/or re-calibrated. Thus, block calibration, also known as read voltage shifting, is an important aspect of enhancing endurance and retention for storage systems, e.g., particularly enterprise-level Flash systems, by reducing the RBER experienced. This block calibration corresponds to the read voltages and refers to algorithms that are able to track the changes of the threshold voltages, thereby significantly improving the performance consistency in the respective device by reducing read tail latency which would otherwise result from error recovery mechanism invocations.

Moreover, adjustments to the read voltages are applied during a read command accordingly. It follows that the threshold voltage represents the voltage required to turn on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
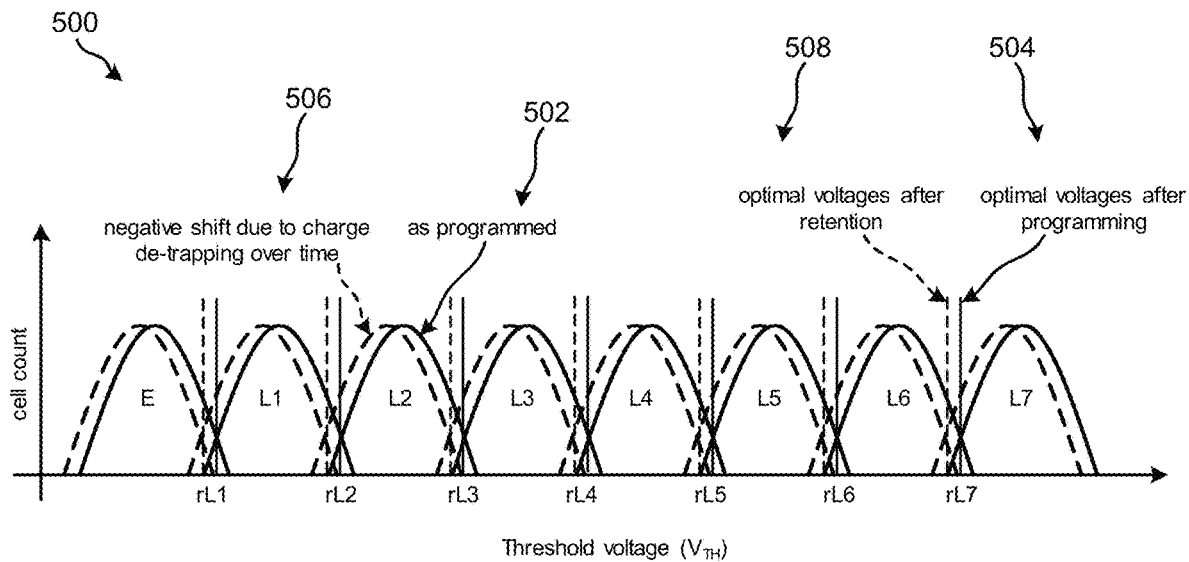
FIG. 5 is a graph which illustrates the threshold voltage shifting phenomenon, in accordance with one embodiment.

Referring momentarily to FIG. 5, a graph 500 illustrating the threshold voltage shifting phenomenon is illustrated in accordance with an example. The x-axis of the graph 500 represents the programmed threshold voltage VTH, while the y-axis represents the corresponding cell count of a TLC NAND memory block. In TLC NAND, each memory cell stores 3 bits of information, therefore, the VTH distributions correspond to 8 possible discrete levels (E, L1, . . . , L7). The solid distributions 502 indicate the VTH levels after programming. The vertical solid lines 504 indicate the read voltages (rL1, . . . , rL7) that are optimal for the VTH distributions 502. The dashed distributions 506 indicate a negative shift of the VTH levels due to charge loss over time. Because of this negative shift to lower voltages, the read voltages 504 are no longer optimal. Indeed, a negative offset must be applied to the read voltages in order to account for the changes of the VTH distributions from 502 to 506. The vertical dashed lines 508 indicate the read voltages (rL1, . . . , rL7) that are optimal during retention for the VTH distributions in 506. In general, each of the 8 levels (E, L1, . . . , L7) shown in the figure may have a different VTH shift and thus, each of the 7 read voltages (rL1, . . . , rL7) may have a different optimal shift.

Accordingly, the read voltage shift values are preferably determined shortly after a block has been written to and/or periodically thereafter. The threshold voltage can be considered an index of the memory state, as determined by measuring the source-drain current when a control gate bias is applied to the memory cell. Typically, upon a read operation, a read voltage between adjacent nominal threshold voltages is used to determine the memory cell state. As the threshold voltage value of the memory cell changes (as explained above), the read voltage applied during a read operation is preferably shifted using an offset value to obtain optimal readout conditions and minimize RBERs. Subsequently, the optimal read voltage shift values may be updated periodically, e.g., in a background health check.

As mentioned above, although increases to RBERs are irreparable for some blocks of storage space (e.g., such as those caused by prolonged P/E cycles), increases to RBERs caused by events such as retention and/or read disturbances are transient in the sense that the blocks which are affected are not irreversibly damaged. Rather, this unfavorable increase in RBERs is remedied when the corresponding memory blocks are erased and programmed. In other approaches, transient effects may be remedied by performing a re-calibration of the blocks such that the corresponding read voltages are corrected. It follows that blocks experiencing transient RBER increases may be remedied by being erased, programmed, and re-calibrated, and yet there may be blocks for which the same erase, program, or re-calibration operation may have no effect due to other irreversible effects that result in an irreversibly increased RBER.

However, conventional processes that determine the reliability of pages in memory based on hard detection using the respective ECC have been unable to distinguish irreversibly damaged blocks from blocks which have only experienced a transient increase in RBER. For instance, these conventional processes assume that correct (accurate) read voltages are used when reading a given page, whereas a high number of errors may be returned from a reliable page due to inaccurate read voltages that may be corrected by implementing a more advanced calibration process.

Accordingly, conventional processes have suffered from significant inefficiencies, not only in the process of identifying portions of memory which would benefit from calibration, but also in performing the calibration process itself, as numerous blocks would often be unnecessarily erased, programmed, and re-calibrated, and potentially prematurely retired due to transiently elevated error counts soon after programming. Yet numerous other blocks would often be unnecessarily re-calibrated again and again in some situations, thereby resulting in a calibration overload that can cause other blocks to not be calibrated in time and thus may result in complete failures to read data. Moreover, in modern 3-D TLC and QLC NAND Flash, the number of pages in a block and the number of blocks in a package have been substantially increased with respect to previous generation 2-D NAND Flash. As a result, it may take longer before a particular page or block is inspected during the regular background process.

In sharp contrast to the aforementioned shortcomings experienced by conventional processes, various ones of the embodiments included herein prevent the excessive consumption of internal bandwidth by avoiding the performance of unnecessary calibration operations for certain blocks without increasing the risk of experiencing an uncorrectable read error as a result. Specifically, some of the embodiments described herein are able to accurately detect and manage unreliable pages of storage space in NVRAM. In other words, some of the embodiments included herein are able to distinguish between pages which are experiencing permanent errors and therefore cannot be improved by read voltage calibration and pages which are experiencing transient effects of limited data retention performance. In different approaches, this identification is made by implementing multiple different calibration procedures which are collectively able to determine whether each page (or group of pages) is experiencing a permanent error and therefore whether each page is reliable or not. As a result, the number of unnecessary block calibrations performed is significantly reduced, while also maintaining efficient memory utilization and desirable RBER levels, e.g., as will be described in further detail below.

Figure 6A:
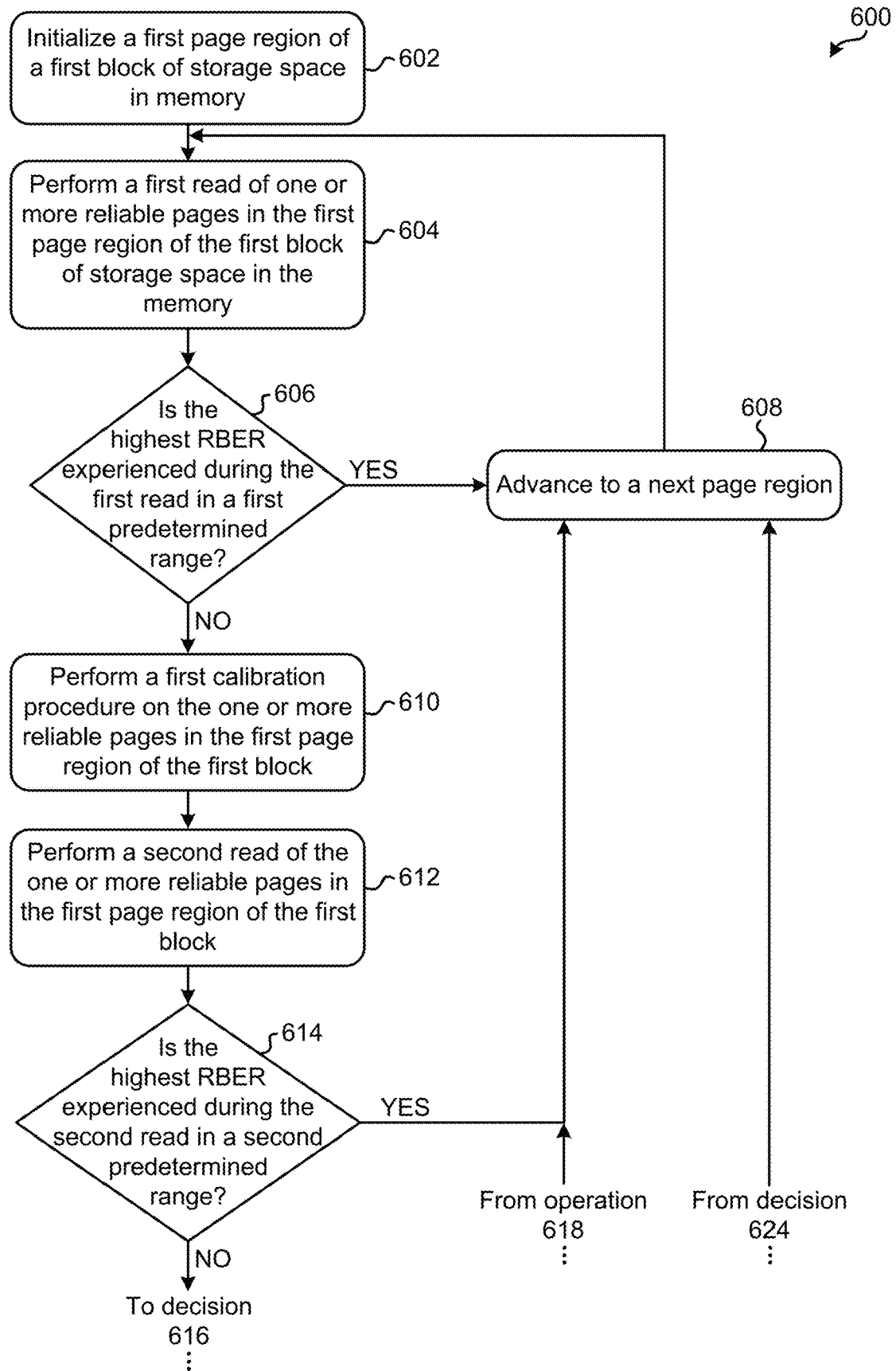
FIG. 6A is a flowchart of a method, in accordance with one embodiment.
Figure 6A:
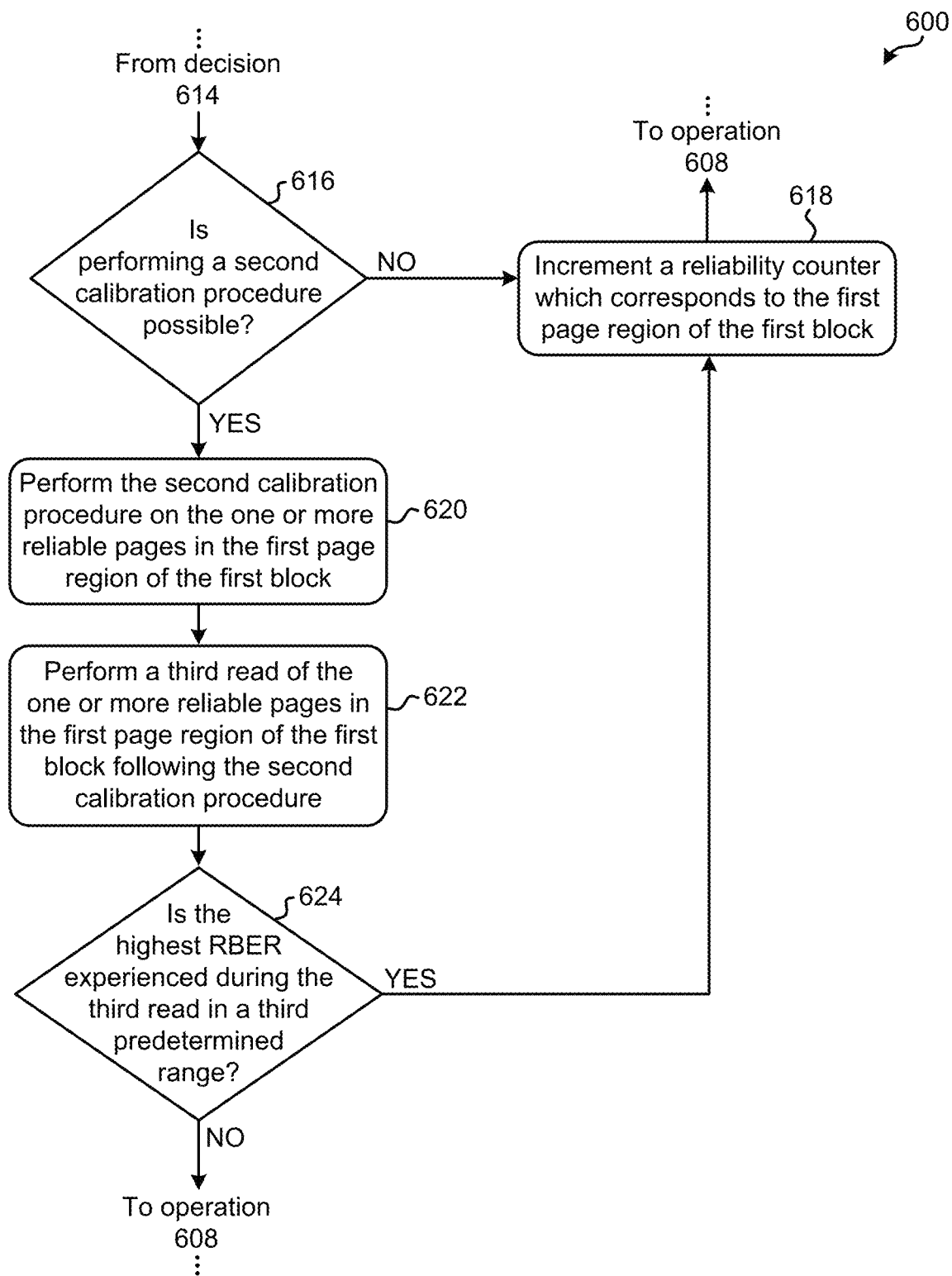

Referring now to FIG. 6A, a flowchart of a method 600 for evaluating the reliability of pages of storage space in memory is illustrated in accordance with one embodiment. The method 600 may be performed in accordance with the present invention in any of the environments depicted in FIGS. 1-5, among others, in various embodiments. For instance, any of the processes included in method 600 may be performed with respect to blocks of storage space in 3-D TLC NAND Flash, 3-D QLC NAND Flash, 2-D NAND Flash, etc., or any other desired type of memory. Furthermore, more or less operations than those specifically described in FIG. 6A may be included in method 600, as would be understood by one of skill in the art upon reading the present descriptions.

Each of the steps of the method 600 may be performed by any suitable component of the operating environment. For example, in various embodiments, the method 600 may be partially or entirely performed by a controller (e.g., Flash controller), a processor, a computer, etc., or some other device having one or more processors therein. Thus, in some embodiments, method 600 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module (s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, operation 602 of method 600 includes initializing a first page region of a first block of storage space in memory. In some approaches, a page region is initialized using a processor performing known logical to physical translation techniques capable of accessing the one or more pages in the given page region. As described above, NVRAM includes a plurality of blocks of storage space, and each of the blocks further include a plurality of pages. With respect to the present description, a "page region" may include all pages in the respective block, a single page in the respective block, a group of pages in the respective block, etc. It follows that each block of storage space can include one or more page regions therein. Moreover, the one or more pages which are included in a given page region may be identified using various criteria, e.g., such as group of pages that are of the same type (lower pages, upper pages, etc.) and which belong to a same layer or group of layers, etc.

Operation 604 further includes performing a first read of one or more reliable pages in the first page region of the first block of storage space in the memory. As mentioned above, the first page region includes one or more of the pages which are included in the first block. Moreover, it is preferred that of the one or more pages included in the first page region, only those pages which are still considered as being "reliable" are read during the first read procedure. With respect to the present description, a "reliable page" is a page which has not been identified as being unrecoverable as a result of permanent errors. In other words, reliable pages are ones which have not experienced a high RBER, or which are experiencing an elevated RBER as a result of transient effects that may be reversed, e.g., by performing one or more calibration procedures. Conversely, an "unreliable page" is a page which has been identified as experiencing a high RBER as a result of permanent errors, the performance of which cannot be repaired by performing calibration procedures, and usually such a high RBER approaches or exceeds the correction capability of the used ECC.

In some approaches, the first read performed in operation 604 uses read voltage shift values which have been stored for each of the respective one or more pages in the first page region. However, a default read voltage may be used to read pages which do not have a read voltage shift value assigned thereto. A default read voltage may be predetermined based on product testing, based on industry standards, set based on user preferences, etc. Moreover, the one or more reliable pages in the first page region may be read using a processor performing known data access commands and/or operations to determine the information stored therein.

Method 600 also includes determining whether a highest RBER experienced during the first read is in a first predetermined range. See decision 606. It follows that in some approaches, performing decision 606 includes identifying a page in the first page region which resulted in a highest (e.g., "max" or "maximum") RBER when read.

In some approaches, the extents of the first predetermined range may be expressed with respect to an ECC limit for the memory. According to an example, which is in no way intended to limit the invention, the first predetermine range extends between a RBER of zero (i.e., no errors occurred while reading the given page) and a RBER which equates to 80% of the maximum number of bit errors which can be corrected by the ECC. As mentioned above, a page is identified as having the highest RBER of all pages in the first page region. In other words, a page is identified as the worst performing page of all pages included in the first page region as measured with respect to the RBER. Comparing the worst performing page of a given block to the first predetermined range which is expressed with respect to an ECC limit for the memory gives an accurate representation of whether the first page region as a whole is capable of performing at a level which at least ensures that data is still capable of being accessed therefrom, e.g., using ECC.

In response to determining that the highest RBER experienced during the first read is in the first predetermined range, method 600 proceeds from decision 606 to operation 608. There, operation 608 includes advancing to a next (e.g., subsequent) page region. As mentioned above, each block in the memory may include one or more page regions therein, e.g., depending on the number of pages included in the one or more page regions and/or the block itself. Thus, in some approaches the "next" page region is also in the first block, while in other approaches the "next" page region is in a second block of the memory which is different than the first block. The actual sequence of inspecting the page regions in method 600 may depend on the policy, based on which the controller inspects the various page regions. For example, the controller may inspect at least one page region from each block within a minimum predetermined period, in which case operation 608 advances to the first page region of the second block and returns to the second page region of the first block after having inspected all first page regions of all the blocks that hold valid data.

The manner in which method 600 actually advances between page regions and/or blocks of storage space in operation 608 may involve different schemes, e.g., depending at least in part on the read scrub method implemented. For example, a read scrub process may be implemented which monitors page RBERs by reading the pages, page regions, and blocks in a specific interleaved order which ensures a reduced amount of delay time experienced between reading various pages (e.g., see method 1000 in FIG. 10 below).

From operation 608, method 600 returns to operation 604 such that the subsequent page region is read and decision 606 is repeated. However, method 600 proceeds to operation 610 in response to determining that the highest RBER experienced during the first read is not in the first predetermined range. There, operation 610 includes performing a first calibration procedure on the one or more reliable pages in the first page region of the first block.

The first calibration procedure performed on the one or more reliable pages in the first page region is preferably capable of being performed in a relatively small amount of time, e.g., at least with respect to subsequent calibration procedures which may be performed as will soon become apparent. According to an illustrative approach, the first calibration procedure includes an on-demand calibration that can be utilized to complement and provide a more rapid calibration than that provided by a regular periodic calibration. An on-demand calibration is able to calibrate one page or a subset of the pages in a page region and subsequently apply the read voltage offsets determined during calibration to a remainder of the pages in the page region. Because this on-demand calibration operates on a limited number of the pages in a given page region, it can be performed relatively quickly by utilizing background read operations, thereby reducing any associated read disturb effects. Although using such a limited set of pages to determine read voltage offsets can lead to offset values that are sub-optimal for the page group, this undesirable result can be ameliorated to a large extent by grouping pages together that have similar characteristics, e.g., as would be appreciated by one skilled in the art after reading the present description.

In other approaches, the first calibration procedure may simply involve applying a read-offset option which is determined based on entries in a lookup table. In still other approaches, the first calibration procedure involves performing a snap calibration. For instance, referring momentarily to FIG. 6B, exemplary sub-processes of performing a first calibration procedure are illustrated in accordance with one embodiment, one or more of which may be used to perform operation 610 of FIG. 6A. However, it should be noted that the sub-processes of FIG. 6B are illustrated in accordance with one embodiment which is in no way intended to limit the invention.

As shown, performing the first calibration procedure includes selecting a group of one or more pages of memory. See sub-operation 650. Each of the pages further include a plurality of memory cells. The specific number of memory cells included in a given page varies depending on the type of memory incorporated.

Figure 6B:
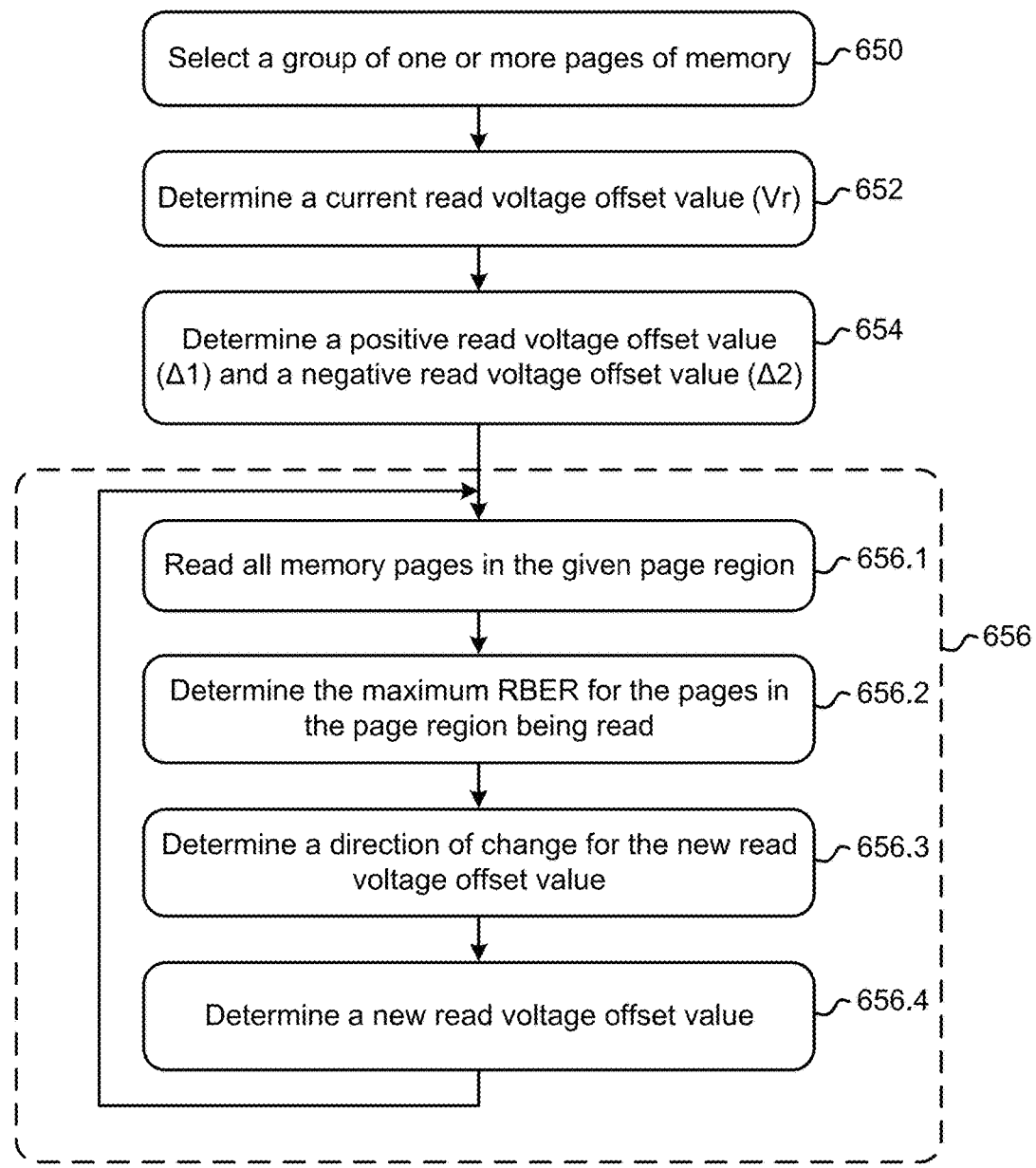
FIG. 6B is a flowchart of sub-processes for one of the operations in the method of FIG. 6A, in accordance with one embodiment.

Referring still to FIG. 6B, sub-operation 652 includes determining a current read voltage offset value (Vr). Moreover, sub-operation 654 includes determining a positive read voltage offset value ($\Delta 1$) and a negative read voltage offset value ($\Delta 2$). In some approaches, sub-operation 654 also includes determining a damping factor $\varepsilon$ which corresponds to the positive read voltage offset value ($\Delta 1$) and the negative read voltage offset value ($\Delta 2$), but is in no way required.

Proceeding to sub-operation 656, a looped (e.g., repeating) process is performed. Looped sub-operation 656 may repeat itself until a stop condition is fulfilled. According to some approaches, the stop condition may include determining that a given read voltage offset value has resulted in generating a lowest possible number of read errors per region of memory pages. However, any other stop conditions may be applied, e.g., such as reaching a maximum number of iteration cycles, receiving a stop command from a user, etc.

Looking to the specific operations included in the looped process of sub-operation 656, operation 656.1 includes reading all memory pages in the given page region using read voltage offset values of Vr, Vr+$\Delta 1$, and Vr+$\Delta 2$. Moreover, operation 656.2 includes determining for each of the read voltage offset values the maximum RBER for the page region being read. Operation 656.3 also includes determining a direction of change for the new read voltage offset value using the maximum RBERs obtained from reading the pages in the given page region using the aforementioned read voltage offset values.

Furthermore, operation 656.4 includes determining a new read voltage offset value by applying a function to the current read voltage offset value. According to an exemplary approach, which is in no way intended to limit the invention, the function applied to the current read voltage offset value implements one or more of the current read voltages, the direction of change, the positive read voltage offset value, the negative read voltage offset value, and the damping factor $\varepsilon$, as parameters. From operation 656.4, the flowchart returns to operation 656.1 such that the looped nature of sub-operation 656 is repeated, e.g., as mentioned above.

Returning now to FIG. 6A, method 600 proceeds from operation 610 to operation 612, which includes performing a second read of the one or more reliable pages in the first page region of the first block. Performing the second read in operation 612 may implement any one or more of the approaches described above with respect to performing the first read in operation 604.

Method 600 then includes determining whether a highest RBER experienced during the second read is in a second predetermined range. See decision 614. As mentioned above, in some approaches, performing decision 614 includes identifying a page in the first page region which resulted in a highest (e.g., "max" or "maximum") RBER when read. It should also be noted that the page in the first page region which resulted in a highest RBER when read during the second read may be the same or different than the page in the first page region which resulted in a highest RBER when read during the first read.

In some approaches, the extents of the second predetermined range may be expressed with respect to an ECC limit for the memory. However, the second predetermine range may also be more confined than the first predetermined range, e.g., in order to ensure increased read performance. According to an example, which is in no way intended to limit the invention, the second predetermine range extends between a RBER of zero (i.e., no errors occurred while reading the given page) and a RBER which equates to 60% of the maximum number of bit errors which can be corrected by the ECC. Again, a page is identified as having the highest RBER of all pages in the first page region. Therefore, a page identified as the worst performing page of all pages included in the first page region as measured with respect to the RBER. Comparing the worst performing page of a given block to the second predetermined range which is expressed with respect to an ECC limit for the memory gives an accurate representation of whether the first page region as a whole is capable of performing at a level which at least ensures that data is still capable of being accessed therefrom, e.g., using ECC.

In response to determining that the highest RBER experienced during the second read is in the second predetermined range, method 600 proceeds from decision 614 to operation 608. There, operation 608 includes advancing to a next (e.g., subsequent) page region as described above. However, method 600 proceeds from decision 614 to decision 616 in response to determining that the highest RBER experienced during the second read is not in the second predetermined range. There, decision 616 includes determining whether performing a second calibration procedure on the first page region is possible. In preferred approaches, the second calibration procedure involves more effective read voltage optimization algorithms than the first calibration procedure, and therefore performing the second calibration procedure is more workload intensive than performing the first calibration procedure. It follows that the overarching storage system's available amount of processing resources has an effect on whether the second calibration procedure can be performed at a given point in time. In some approaches, a storage controller may evaluate whether an existing read bandwidth would be affected by performing the second calibration procedure. In other words, decision 616 includes determining whether an available amount of computing bandwidth is currently available, e.g., based on a current workload, to conduct the second calibration procedure.

In response to determining that performing a second calibration procedure on the first page region is not currently possible, method 600 proceeds to operation 618 from decision 616. There, operation 618 includes incrementing a reliability counter which corresponds to the first page region of the first block. The reliability counter essentially serves as a running counter which indicates the performance reliability of the corresponding page region in the given block of storage space. For instance, as the reliability counter for a given page region increases over time, it can be deduced that the given page region is continuing to experience poor performance and therefore high RBERs. In some approaches, once the reliability counter for a page region becomes sufficiently high, that page region may be degraded and/or retired from any further use (e.g., see FIG. 8 below). However, the reliability counter for a page region may also be decremented over time in response to the page region experiencing sufficiently low RBERs over a period of time (e.g., see FIGS. 9A-9B below).

From operation 618, method 600 proceeds to operation 608 which includes advancing to a next (e.g., subsequent) page region as described above. However, it should be noted that in some approaches, performing the second calibration procedure may be deferred to a point in time that adequate computing resources are available. For instance, the first page region may be held in a queue until the computational workload of the storage system dropped to the point that performing the second calibration procedure was possible.

Returning to decision 616, method 600 proceeds to operation 620 in response to determining that performing the second calibration procedure on the first page region is possible. Accordingly, operation 620 includes actually performing the second calibration procedure on the one or more reliable pages in the first page region of the first block. Again, the second calibration procedure preferably involves more effective read voltage optimization algorithms than the first calibration procedure, and therefore performing the second calibration procedure is more workload intensive than performing the first calibration procedure. Performing the first calibration procedure also consumes a smaller amount of time than an amount of time consumed performing the second calibration procedure in most approaches. In other words, the first calibration procedure serves as a "coarse" level of calibration, while the second calibration procedure serves as a "fine" level of calibration.

According to some approaches, the second calibration procedure includes performing a vendor-specific calibration command. In other approaches, the second calibration procedure may simply involve applying a sequence of read-offset options which is determined based on entries in a lookup table. In still other approaches, the second calibration procedure involves performing a modified read process with in-line support for data correction, e.g., as will be described in further detail below (see FIG. 6C).

Referring still to FIG. 6A, operation 622 includes performing a third read of the one or more reliable pages in the first page region of the first block following the second calibration procedure. Performing the third read in operation 622 may implement any one or more of the approaches described above with respect to performing the first read in operation 604 and/or the second read in operation 612.

Method 600 then includes determining whether a highest RBER experienced during the third read is in a third predetermined range. See decision 624. As mentioned above, in some approaches, performing decision 624 includes identifying a page in the first page region which resulted in a highest RBER when read during the third read. It should also be noted that the page in the first page region which resulted in a highest RBER when read during the third read may be the same or different than the page in the first page region which resulted in a highest RBER when read during the first and/or second read.

In some approaches, the extents of the third predetermined range may be expressed with respect to an ECC limit for the memory. However, the third predetermine range may also be more confined than the first and second predetermined ranges, e.g., in order to ensure increased read performance. According to an example, which is in no way intended to limit the invention, the third predetermine range extends between a RBER of zero (i.e., no errors occurred while reading the given page) and a RBER which equates to 50% of the maximum number of bit errors which can be corrected by the ECC. Again, a page is identified as having the highest RBER of all pages in the first page region. Therefore, a page is identified as the worst performing page of all pages included in the first page region as measured with respect to the RBER. Comparing the worst performing page of a given block to the third predetermined range which is expressed with respect to an ECC limit for the memory gives an accurate representation of whether the first page region as a whole is capable of performing at a level which at least ensures that data is still capable of being accessed therefrom, e.g., using ECC.

In response to determining that the highest RBER experienced during the third read is in the third predetermined range, method 600 proceeds from decision 624 to operation 618. As mentioned above, operation 618 includes incrementing a reliability counter which corresponds to the first page region of the first block. The reliability counter essentially serves as a running counter which indicates the performance reliability of the corresponding page region in the given block of storage space, e.g., as will be described in further detail below.

Returning to decision 624, method 600 jumps to operation 608 in response to determining that the highest RBER experienced during the third read is not in the third predetermined range. Again, operation 608 includes advancing to a next (e.g., subsequent) page region such that additional page regions may be evaluated, e.g., as described above. It follows that the various processes included in method 600 are repeated in an iterative fashion for each page region in each block of storage space in the memory. In other words, method 600 may be implemented as an ongoing read scrub operation which is performed in the background, so as to not interrupt ongoing data access operations.

It should be noted that "in a first predetermined range", "in a second predetermined range" and similarly "in a third predetermined range" are in no way intended to limit the invention. Rather than determining whether a value is in a predetermined range, equivalent determinations may be made, e.g., as to whether a value is greater than a predetermined threshold, whether a value is outside a predetermined range, whether an absolute value is above a threshold, whether a value is below a threshold, etc., depending on the desired approach.

The various approaches described herein with respect to method 600 are able to improve prevent the excessive consumption of internal bandwidth by avoiding the performance of unnecessary calibration operations for certain blocks without increasing the risk of experiencing an uncorrectable read error as a result. Specifically, some of the embodiments described herein are able to accurately detect and manage unreliable pages of storage space in NVRAM.

However, it should also be noted that the specific processes illustrated in FIG. 6A are in no way intended to limit the invention. For instance, additional criterion may be evaluated in order to determine whether the first and/or second calibration procedures should be performed. According to an example, which is in no way intended to limit the invention, the difference between the maximum RBER experienced during the second read and the maximum RBER experienced during the first read may be compared to a threshold in order to determine whether the second calibration procedure should be applied. According to another example, again which is in no way intended to limit the invention, the difference between the maximum RBER experienced during the third read and the maximum RBER experienced during the second read may be compared to another threshold in order to determine whether the reliability counter of the first page region should be incremented.

Furthermore, as previously mentioned, the second calibration procedure preferably involves more effective read voltage optimization algorithms than the first calibration procedure, and therefore performing the second calibration procedure is more workload intensive than performing the first calibration procedure. Performing the first calibration procedure also consumes a smaller amount of time than an amount of time consumed performing the second calibration procedure in most approaches. In other words, the first calibration procedure serves as a "coarse" level of calibration, while the second calibration procedure serves as a "fine" level of calibration.

Figure 6C:
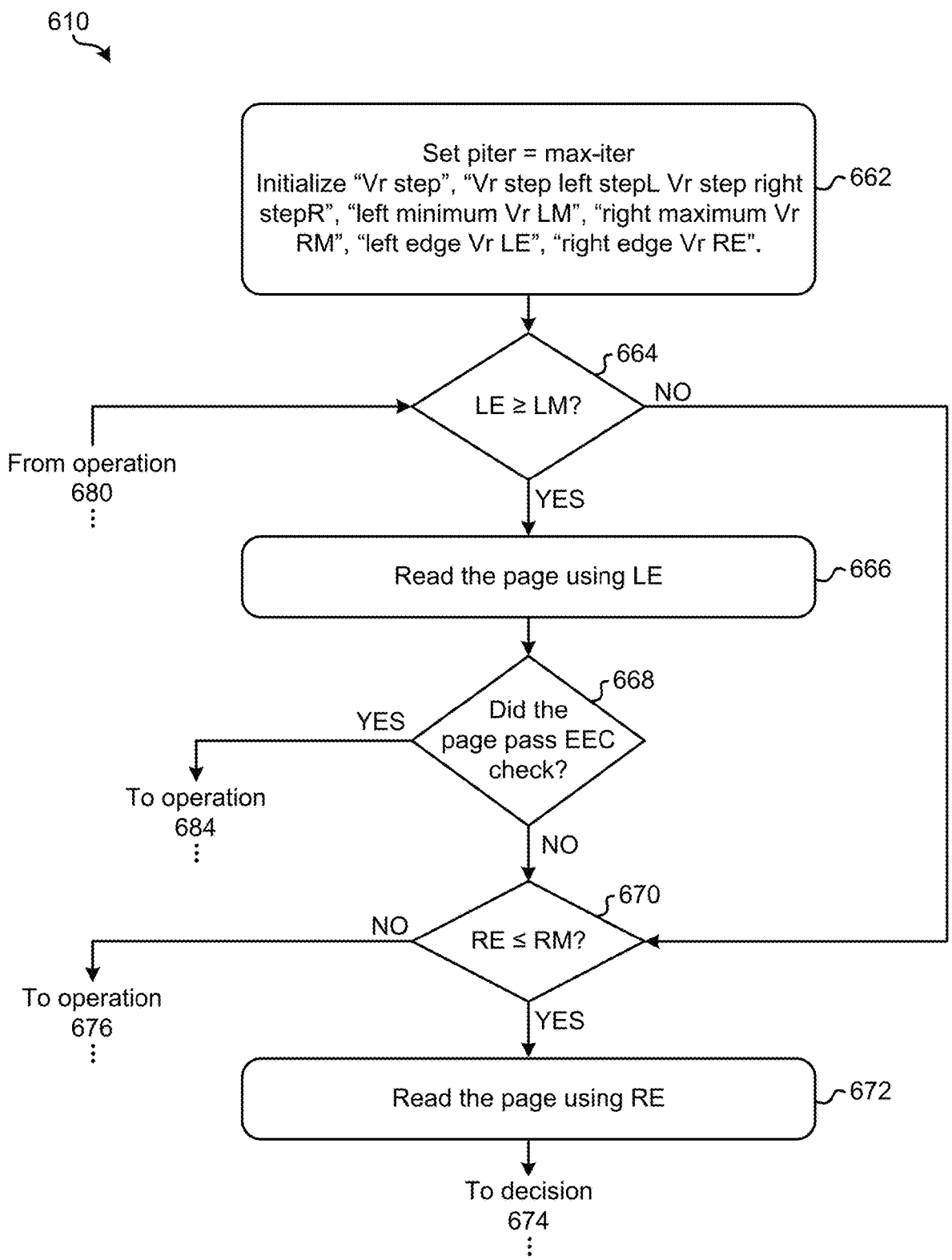
FIG. 6C is a flowchart of sub-processes for one of the operations in the method of FIG. 6A, in accordance with one embodiment.
Figure 6C:
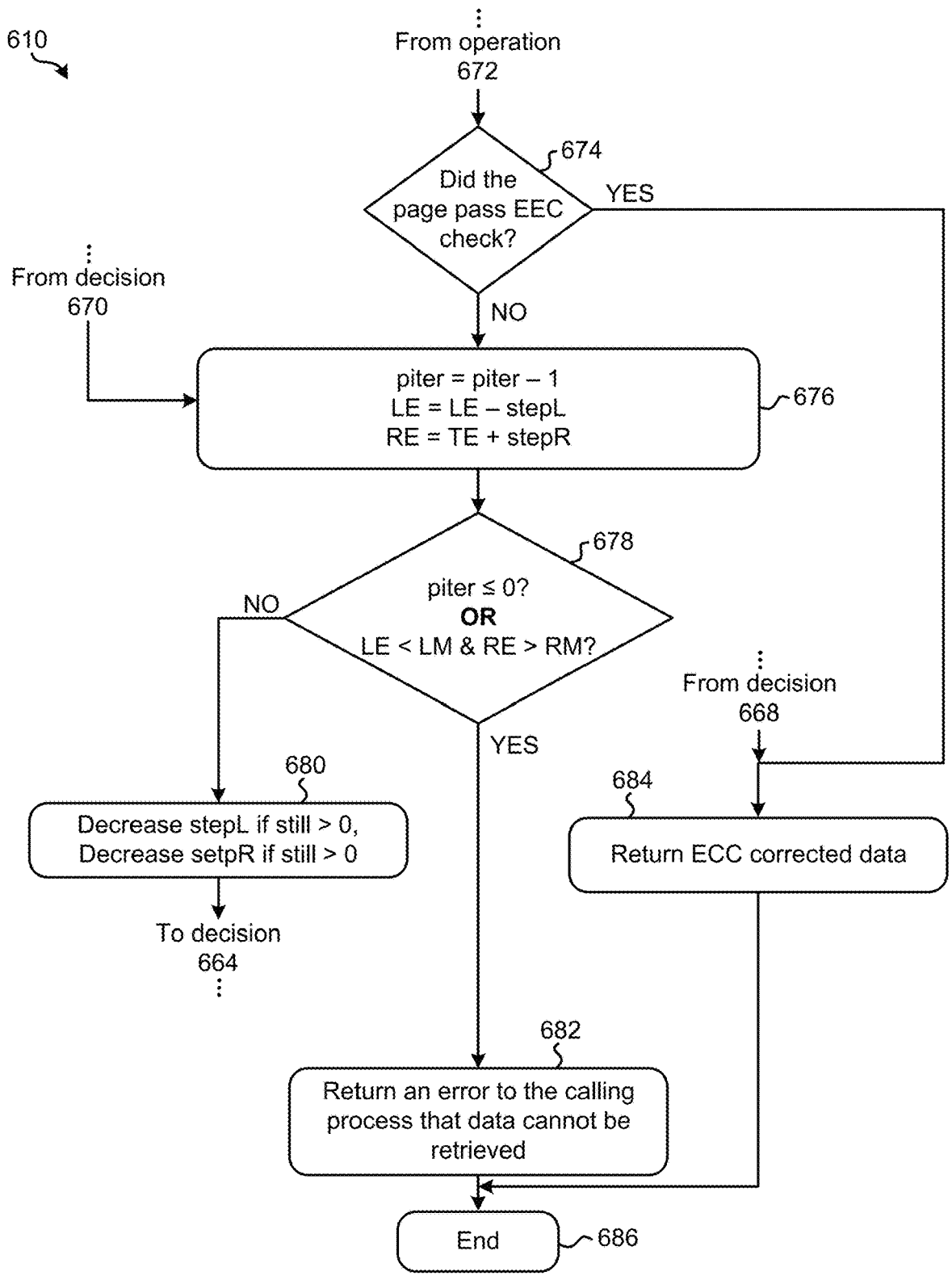

For instance, referring momentarily to FIG. 6C, exemplary sub-processes of performing a second calibration procedure which involves a modified read process with in-line support for data correction are illustrated in accordance with one embodiment, one or more of which may be used to perform operation 620 of FIG. 6A. The flowchart of FIG. 6C involves adapting read voltage offset (Vr) values so that left and right shifted Vr values are evaluated during each iteration. The algorithm reduces latency by attempting more coarse Vr increments initially, increasing the granularity and thus latency in response to not identifying a valid Vr value. However, it should be noted that the sub-processes of FIG. 6C are illustrated in accordance with one embodiment which is in no way intended to limit the invention.

As shown, performing the second calibration procedure initially includes naming the maximum page correction iterations "max-iter", as well as the current iteration counter "piter", and setting them equal to each other. See sub-operation 662. Moreover, sub-operation 662 also includes initializing "Vr step", "Vr step left stepL Vr step right stepR", "left minimum Vr LM", "right maximum Vr RM", "left edge Vr LE", and "right edge Vr RE".

Decision 664 includes determining whether the left Vr edge value "LE" is greater than or equal to the value of the left minimum "Vr LM". In response to determining that LE is greater than or equal to LM, the flowchart proceeds to sub-operation 666 where the page is actually read. In some approaches, the page is read using a Vr value which is equal to LE. Moreover, decision 668 includes determining whether the page can pass an ECC check. In response to determining that the page can pass an ECC check, the flowchart jumps to sub-operation 684. There, sub-operation 684 includes returning ECC corrected data to the calling process, and the page correction process is completed at sub-operation 686.

Returning to decision 668, the flowchart proceeds to decision 670 in response to determining that the page cannot pass an ECC check. There, decision 670 includes determining whether "RE" is less than or equal to "RM". It should also be noted that the flowchart proceeds directly to decision 670 from decision 664 in response to determining that LE is less than LM. Looking specifically to decision 670, the flowchart proceeds to sub-operation 672 in response to determining that "RE" is less than or equal to "RM". There, sub-operation 672 includes actually reading the page using a Vr value of "RE" before proceeding to decision 674 which includes determining whether reading the page passed the ECC check.

In response to determining that the page which was read also passed the ECC check, the flowchart jumps to sub-operation 684. As mentioned above, sub-operation 684 includes returning ECC corrected data to the calling process, before proceeding to sub-operation 686 where the flowchart ends.

Returning to decision 674, the flowchart proceeds to sub-operation 676 in response to determining that the page which was read did not pass the ECC check. There, sub-operation 676 includes decrementing the counter "piter" by a value of 1, which is in no way intended to limit the invention. In other approaches, the counter "piter" may be decremented by any desired amount. Sub-operation 676 also includes decrementing the left Vr edge by the step size "stepL", as well as incrementing the value "RE" by the step size "stepR".

Proceeding to decision 678, a combined determination is performed. Decision 678 includes determining whether the value of the page correction iterations "piter" is less than or equal to zero. Decision 678 alternatively includes determining whether the left edge "LE" is less than the left minimum Vr value "LM" in addition to the right edge "RE" being greater than the right maximum Vr "RM". In response to determining that the value of the page correction iterations "piter" is not less than or equal to zero, or alternatively in response to determining that LE is not less than LM and/or RE is not greater than RM, the flowchart proceeds to sub-operation 680. There, the value of "stepL" is decreased if the value after the decrement is still greater than zero, and the value of "stepR" is decreased if the value after the decrement is still greater than zero. See sub-operation 680. From sub-operation 680, the flowchart returns decision 664 which may be repeated.

Returning to decision 678, the flowchart proceeds to sub-operation 682 in response to determining that the value of the page correction iterations "piter" is less than or equal to zero, or alternatively in response to determining that LE is less than LM and RE is greater than RM. There, sub-operation 682 includes returning an error to the calling process, where the error indicates that the data cannot be read from the given memory page. From sub-operation 682, the flowchart proceeds to sub-operation 686, whereby the second calibration process may end.

Figure 7:
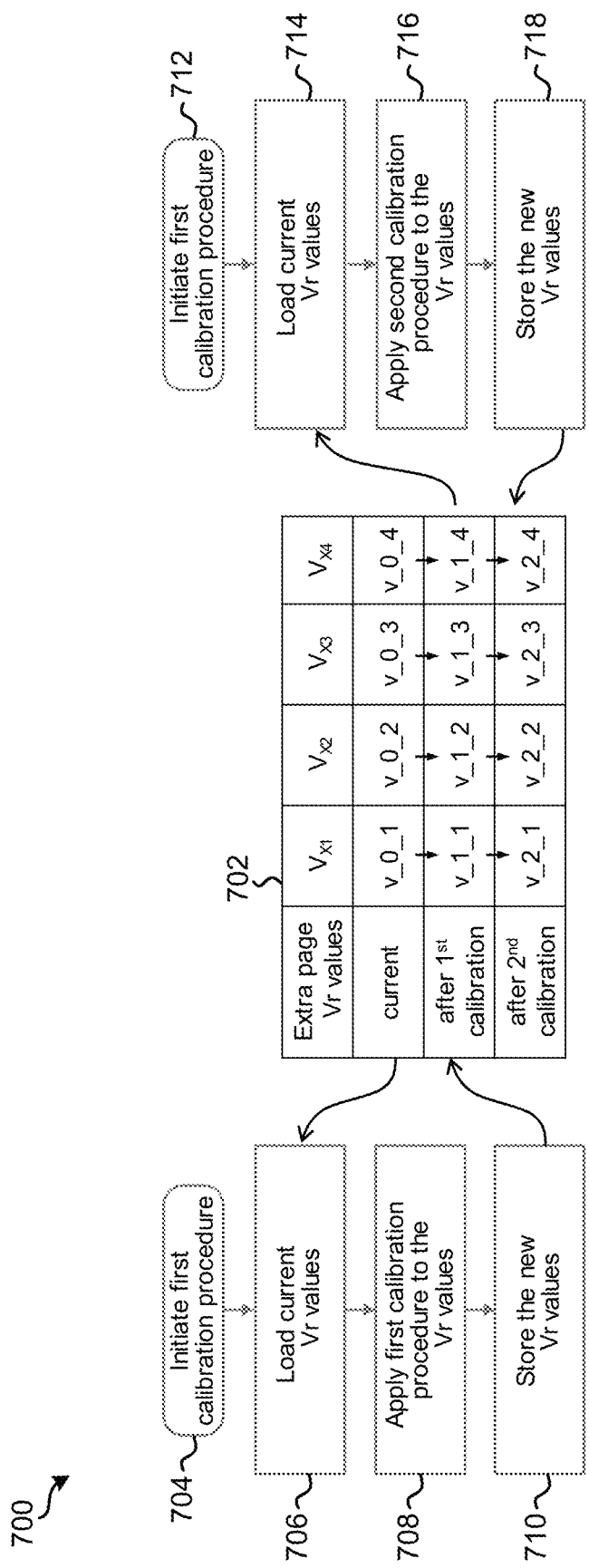
FIG. 7 is a flowchart of a method, in accordance with one embodiment.

Referring now to FIG. 7, a flowchart of a method 700 for adjusting and updating Vr values during calibration procedures is illustrated in accordance with one embodiment. The method 700 may be performed in accordance with the present invention in any of the environments depicted in FIGS. 1-6C, among others, in various embodiments. For instance, any of the processes included in method 700 may be performed with respect to blocks of storage space in 3-D TLC NAND Flash, 3-D QLC NAND Flash, 2-D NAND Flash, etc., or any other desired type of memory. Furthermore, more or less operations than those specifically described in FIG. 7 may be included in method 700, as would be understood by one of skill in the art upon reading the present descriptions.

Each of the steps of the method 700 may be performed by any suitable component of the operating environment. For example, in various embodiments, the method 700 may be partially or entirely performed by a controller (e.g., Flash controller), a processor, a computer, etc., or some other device having one or more processors therein. Thus, in some embodiments, method 700 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 700. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 7, method 700 involves a table 702 which includes a number of Vr values. Specifically, the table 702 includes the Vr values for an exemplary extra page in 3D-TLC NAND having four associated read voltages $V_{X1}$, $V_{X2}$, $V_{X3}$, and $V_{X4}$. Moreover, the current row of table 702 includes a current Vr value for each of the respective voltages, and the remaining rows include updated Vr values, as will soon become apparent.

Looking first to operation 704, the first calibration procedure is initiated for the extra page which corresponds to the values stored in table 702. Operation 706 further includes loading the current Vr values stored in table 702, after which the first calibration procedure is applied to the current Vr values. See operation 708. As mentioned above, performing the first calibration procedure on a given page in a page region typically updates the Vr values associated therewith, e.g., due to read voltage shifting. Accordingly, operation 710 includes storing the new Vr values determined using the first calibration procedure in the after first calibration row of table 702. Thereafter, the first calibration procedure may end, and the remainder of an ongoing evaluation of the page region may be performed.

Looking now to operation 712, the second calibration procedure may be initiated in response to determining that the RBER experienced as a result of reading the page region is undesirably high. Accordingly, operation 714 includes loading the updated Vr values from the after first calibration row of table 702, after which the current Vr values are applied to (e.g., used in) the second calibration procedure. See operation 716. As mentioned above, performing the second calibration procedure on a given page in a page region also typically updates the Vr values associated therewith, e.g., due to read voltage shifting. Accordingly, operation 718 includes storing the new Vr values determined using the second calibration procedure in the after second calibration row of table 702. Thereafter, the second calibration procedure may end, and the remainder of an ongoing evaluation of the page region may be performed. It follows that the first and second calibration procedures are performed in a hierarchical manner, e.g., as described above in reference to FIGS. 6A-6C.

Figure 8:
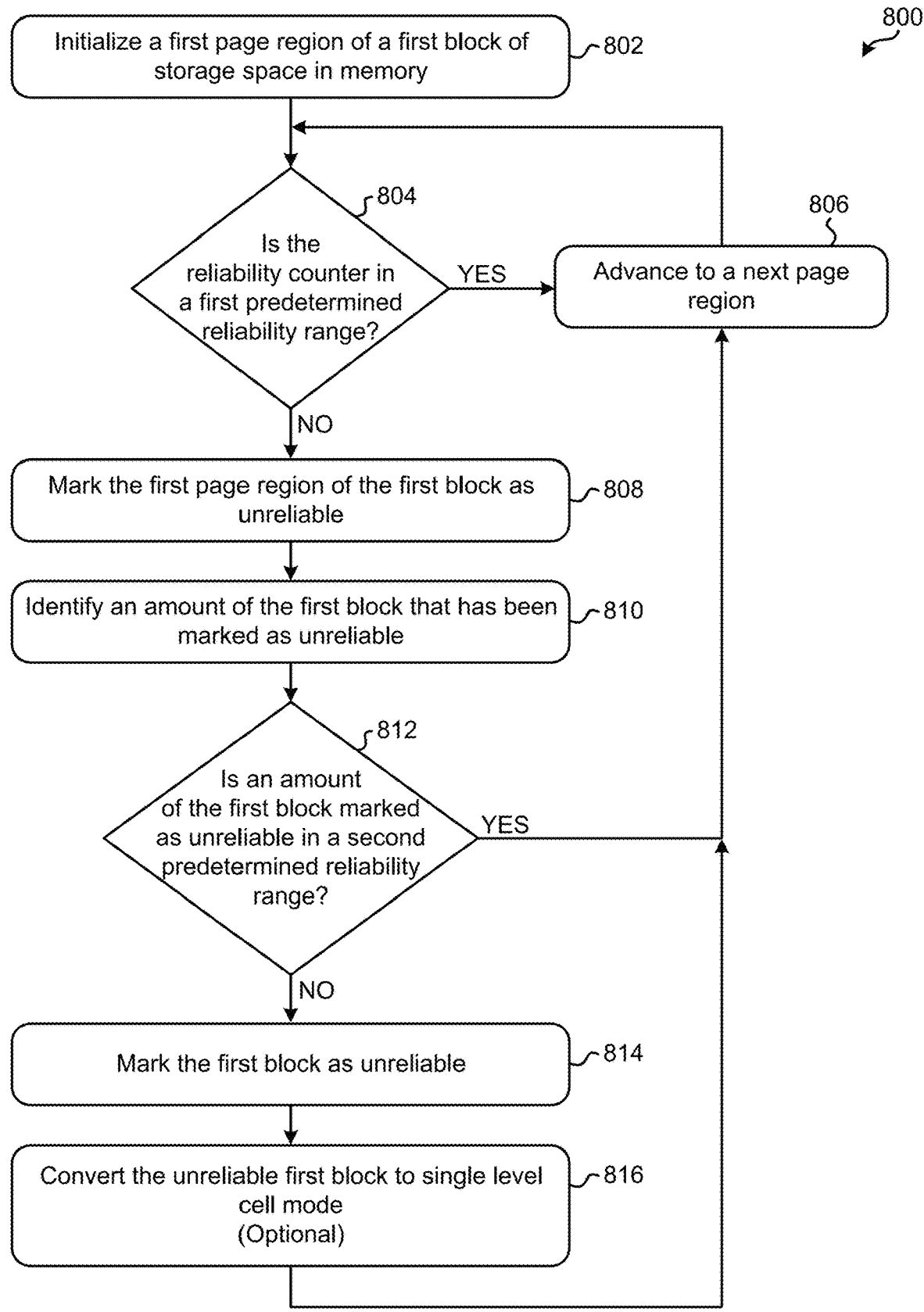
FIG. 8 is a flowchart of a method, in accordance with one embodiment.

As previously mentioned, once the reliability counter for a given page region becomes sufficiently high, that page region may be degraded and/or retired from any further use, e.g., in order to reduce read errors and maintain data storage efficiency. Accordingly, FIG. 8 illustrates a flowchart of a method 800 for evaluating the reliability counter for a given page region and managing performance accordingly, in accordance with one embodiment. The method 800 may be performed in accordance with the present invention in any of the environments depicted in FIGS. 1-7, among others, in various embodiments. For instance, any of the processes included in method 800 may be performed with respect to blocks of storage space in 3-D TLC NAND Flash, 3-D QLC NAND Flash, 2-D NAND Flash, etc., or any other desired type of memory. Furthermore, more or less operations than those specifically described in FIG. 8 may be included in method 800, as would be understood by one of skill in the art upon reading the present descriptions.

Each of the steps of the method 800 may be performed by any suitable component of the operating environment. For example, in various embodiments, the method 800 may be partially or entirely performed by a controller (e.g., Flash controller), a processor, a computer, etc., or some other device having one or more processors therein. Thus, in some embodiments, method 800 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 800. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 8, operation 802 of method 800 includes initializing a first page region of a first block of storage space in memory. The process of initializing the first page region may include any of the approaches described herein and/or any others which would be apparent to one skilled in the art after reading the present description.

Moreover, decision 804 includes determining whether the reliability counter which corresponds to the first page region of the first block is in a first predetermined reliability range. The first predetermined reliability range effectively identifies a range of acceptable performance. In other words, the first predetermined reliability range preferably outlines a range of values the reliability counter for the given page region may have while still being considered as performing desirably well. Moreover, the first reliability range may be predetermined by a user, based on industry standards, based on the type of memory being evaluated, etc. According to an exemplary approach, which is in no way intended to limit the invention, the first predetermined reliability range for the reliability counter may extend from zero to five. However, the extents of the first predetermined reliability range may vary depending on the increments of the reliability counter itself, user preference, the type of memory involved, etc.

In response to determining that the reliability counter which corresponds to the first page region of the first block is in a first predetermined reliability range, method 800 proceeds from decision 804 to operation 806. There, operation 806 includes advancing to a next (e.g., subsequent or second) page region. As mentioned above, each block in the memory may include one or more page regions therein, e.g., depending on the number of pages included in the one or more page regions and/or the block itself. Thus, in some approaches the "next" page region is also in the first block, while in other approaches the "next" page region is in a second block of the memory which is different than the first block.

The manner in which method 800 actually advances between page regions and/or blocks of storage space in operation 806 may involve different schemes, e.g., depending at least in part on the particular approach. For example, a scrubbing process may be implemented which monitors page RBERs by evaluating the pages, page regions, and blocks in a specific interleaved order which ensures a reduced amount of delay time experienced between reading various pages (e.g., see method 1000 in FIG. 10 below).

From operation 806, method 800 returns to decision 804 such that the reliability counter which corresponds to the subsequent page region is evaluated. However, method 800 proceeds to operation 808 from decision 804 in response to determining that the reliability counter corresponding to the first page region is not in the first predetermined reliability range. There, operation 808 includes marking the first page region of the first block as unreliable. The first page region is marked as being unreliable in some approaches by setting one or more flags in the LPT which indicate that the one or more pages in the first page region are unreliable. In other approaches, the first page region is marked as being unreliable by storing the respective LBAs in a lookup table. The pages included in a page region which has been identified as being unreliable may be used with added caution in some approaches, while in other approaches, unreliable pages are discontinued from any further use.

Referring still to FIG. 8, method 800 additionally includes identifying an amount of the first block that has been marked as unreliable. See operation 810. The amount of the first block which has been marked (e.g., identified) as being unreliable depends on the number of pages therein which have been identified as being unreliable. Accordingly, performing operation 810 may involve examining a LPT, a lookup table, the individual pages themselves, etc.

Furthermore, decision 812 includes determining whether an amount of the first block that has been marked as unreliable is in a second predetermined reliability range. Again, a block of storage space includes one or more pages therein. Decision 812 thereby effectively involves determining whether an undesirable number (e.g., percentage) of the one or more pages included in the first block have been identified as being unreliable. According to an exemplary approach, which is in no way intended to limit the invention, the second predetermined reliability range extends from 0% to about 20% of the total number of pages included in the block of storage space. However, the extents of the second predetermined reliability range may vary depending on the number of pages that are actually included in the block, user preference, the type of memory involved, etc.

In response to determining that the amount of the first block that has been marked as unreliable is in the second predetermined reliability range, method 800 returns to operation 806 and advances to a next page region before returning to decision 804 as described above. However, method 800 proceeds from decision 812 to operation 814 in response to determining that the amount of the first block that has been marked as unreliable is not in the second predetermined reliability range. In other words, method 800 proceeds to operation 814 in response to determining that an undesirable number of the pages included in the first block have been marked as unreliable.

There, operation 814 includes marking the first block as unreliable. The first block is marked as being unreliable in some approaches by setting one or more flags in the LPT which indicate that the first block is unreliable. In other approaches, the first block is marked as being unreliable by storing the respective LBA in a lookup table. The pages included in a block which has been identified as being unreliable may be used with added caution in some approaches. For example, in the case of a memory that implements multi level cell technology, e.g., MLC, TLC, or QLC NAND, optional operation 816 includes converting the unreliable first block to single level cell mode. A multi level cell block which has been converted into single level cell mode is effectively used in a limited capacity such that the block is only able to store one bit per cell included therein, e.g., as would be appreciated by one skilled in the art after reading the present description. However, in other approaches, an unreliable block is discontinued from any further use. In other words, a block of storage space identified as being unreliable is retired from any further use in some approaches.

From optional operation 816, method 800 advances to operation 806. Again, operation 806 includes advancing to a next (e.g., subsequent) page region such that additional page regions may be evaluated, e.g., as described above. It follows that the various processes included in method 800 are repeated in an iterative fashion for each page region in each block of storage space in the memory. In other words, method 800 may be implemented as an ongoing scrubbing operation which is performed in the background, so as to not interrupt ongoing data access operations. Accordingly, method 800 is used in preferred approaches to make a reliable decision as to whether a particular page region or an entire block is deemed unreliable based on a number of successive times the particular page region or block has exhibited high RBERs which are either unrepairable or very close to the ECC correction capability.

Figure 9A:
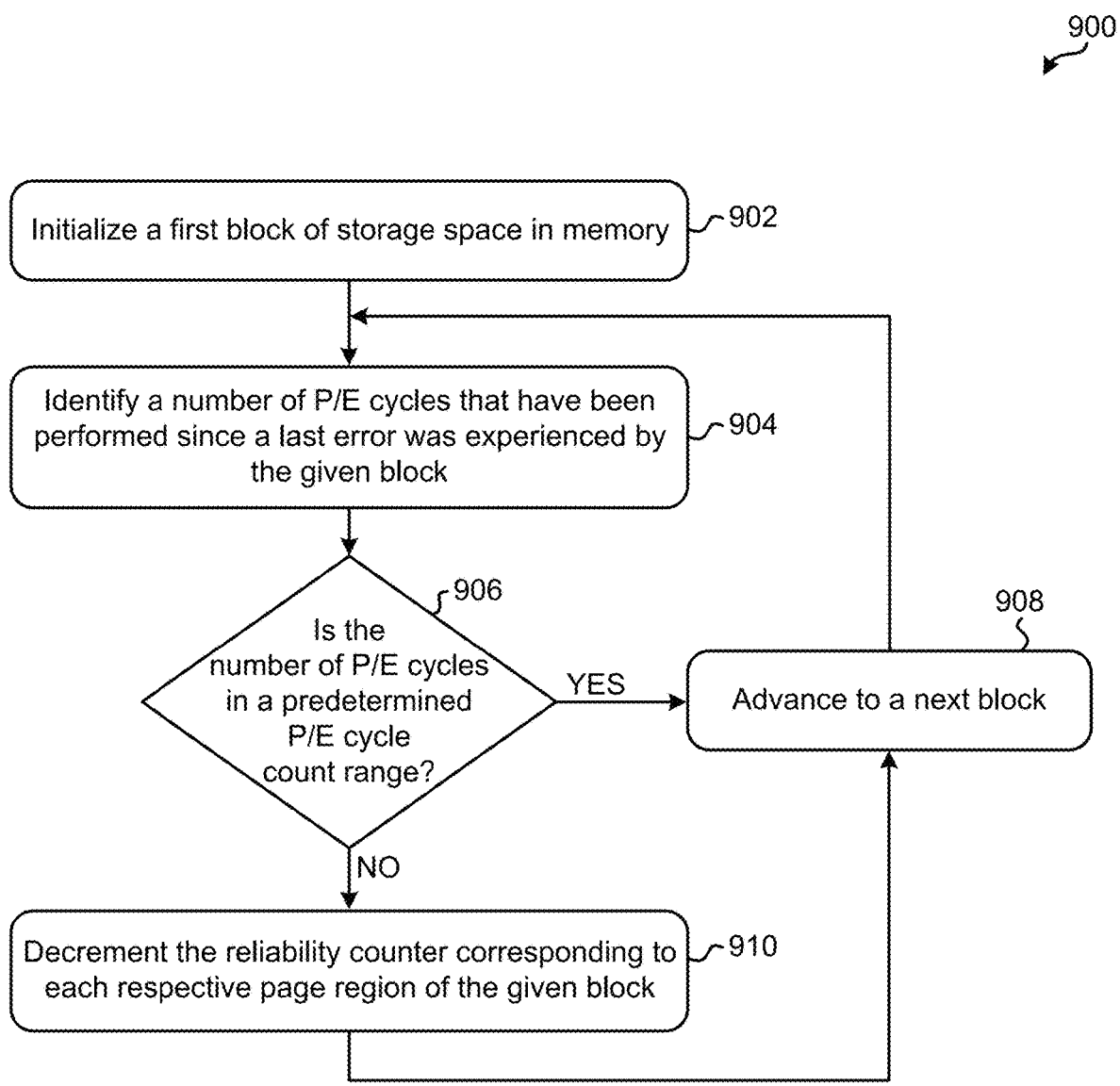
FIG. 9A is a flowchart of a method, in accordance with one embodiment.

It has also been mentioned herein that the reliability counter for a page region may actually be decremented over time in response to the corresponding page region experiencing sufficiently low RBERs over a sufficiently long period of time. Accordingly, FIG. 9A illustrates a flowchart of a method 900 for evaluating the reliability counter for a given page region and decrementing the reliability counter when appropriate, in accordance with one embodiment. The method 900 may be performed in accordance with the present invention in any of the environments depicted in FIGS. 1-8, among others, in various embodiments. For instance, any of the processes included in method 900 may be performed with respect to blocks of storage space in 3-D TLC NAND Flash, 3-D QLC NAND Flash, 2-D NAND Flash, etc., or any other desired type of memory. Furthermore, more or less operations than those specifically described in FIG. 9A may be included in method 900, as would be understood by one of skill in the art upon reading the present descriptions.

Each of the steps of the method 900 may be performed by any suitable component of the operating environment. For example, in various embodiments, the method 900 may be partially or entirely performed by a controller (e.g., Flash controller), a processor, a computer, etc., or some other device having one or more processors therein. Thus, in some embodiments, method 900 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 900. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 9A, operation 902 of method 900 includes initializing a first block of storage space in memory. The process of initializing the first block may include any of the approaches described herein and/or any others which would be apparent to one skilled in the art after reading the present description.

Moreover, operation 904 includes identifying a frequency of P/E cycles to execute a periodic update operation of the block reliability counters. According to some approaches, operation 904 is performed by identifying the type of application workload and then setting the frequency of P/E cycles to a corresponding value, e.g., every 100 P/E cycles in an exemplary case. The performance information relevant to performing operation 904 may be stored in memory (e.g., in a specified location), deduced from general performance records, etc.

Moreover, decision 906 includes determining whether the number of P/E cycles is in a predetermined P/E cycle count range. Method 900 is preferably able to account for temporary effects that may result in a high increase of RBER that appears occasionally with low probability and typically disappears after the block has been erased. Thus, the predetermined P/E cycle count range preferably incorporates numbers of P/E cycle counts. According to one example, which is in not intended to limit the invention, the predetermined P/E cycle count range spans from zero P/E cycles to about 500 P/E cycles, but could be higher or lower depending on the desired approach. Moreover, the P/E cycle count range may be predetermined by a user, by a memory manufacturer, based on industry standards, etc.

In response to determining that the number of P/E cycles is in the predetermined P/E cycle count range, method 900 proceeds from decision 906 to operation 908 which includes advancing to a next (e.g., subsequent or second) block. The manner in which method 900 actually advances between blocks of storage space in operation 908 may involve different schemes, e.g., depending at least in part on the particular approach. For example, a scrubbing process may be implemented which evaluates the blocks in a specific interleaved order which ensures a reduced amount of delay time experienced between reading various pages (e.g., see method 1000 in FIG. 10 below).

From operation 908, method 900 returns to operation 904 such that the number of P/E cycles that have been performed on the given block since the reliability counter corresponding to the given block was incremented is identified. However, method 900 proceeds to operation 910 from decision 906 in response to determining that the number of P/E cycles is not in the predetermined P/E cycle count range. There, operation 910 includes decrementing the reliability counter corresponding to each respective page region of the given block. In other words, in response to determining that the given block has experienced desirable performance for a sufficiently long period of time, the reliability counter of the given block may be decremented. Again, the amount that the reliability counter is decremented depends on the given approach. For example, in some approaches the reliability counter for each page in the given block may be reset to zero, while in other approaches the reliability counters are decremented by a same amount that they were incremented by.

From operation 910, method 900 proceeds to operation 908, which again includes advancing to a next (e.g., subsequent) block of storage space such that additional blocks may be evaluated, e.g., as described above. It follows that the various processes included in method 900 are repeated in an iterative fashion for each block of storage space in the memory. In other words, method 900 may be implemented as an ongoing operation which is performed in the background, so as to performing an inspection procedure for each block of storage space in the memory without interrupt ongoing data access operations.

Figure 9B:
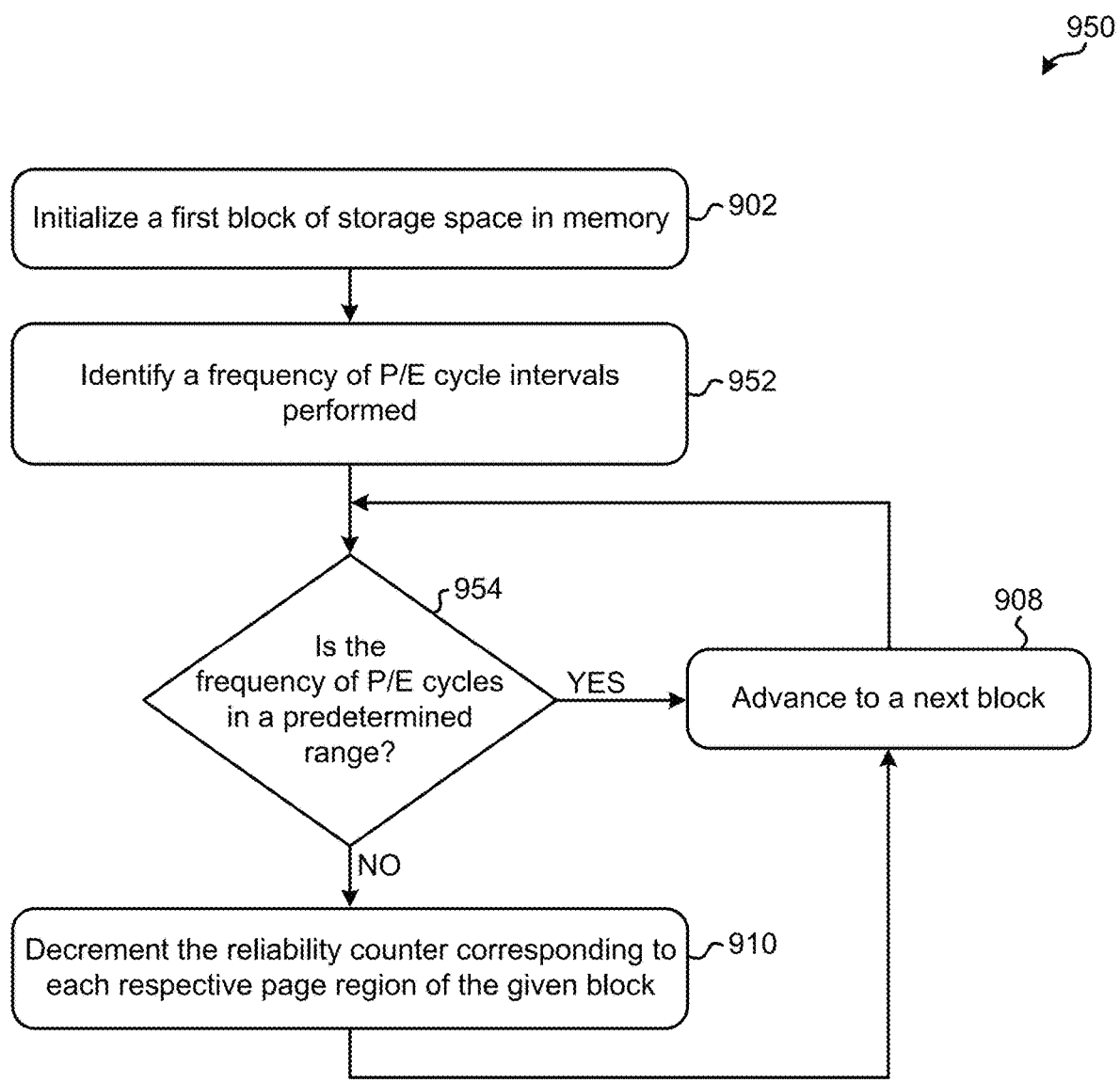
FIG. 9B is a flowchart of a method, in accordance with one embodiment.

Referring momentarily to FIG. 9B, a method 950 is illustrated which includes an alternate progression of at least some of the processes included in method 900 of FIG. 9A. Accordingly, the various processes included in method 950 of FIG. 9B are for evaluating the reliability counter for a given page region as well as decrementing the reliability counter when appropriate, and have common numbering with those in method 900 of FIG. 9A. It follows that method 950 and any of the processes included therein may be performed in accordance with any of the approaches described above with respect to method 900 of FIG. 9A.

As shown, operation 902 of FIG. 9B includes initializing a first block of storage space in memory, e.g., as described above. From operation 902, method 950 proceeds to operation 952 which includes identifying a frequency of P/E cycle intervals that are performed. In some approaches, the frequency of P/E cycle intervals is determined based on current application workloads, while in other approaches the frequency of P/E cycle intervals is determined based on previous application workloads. For instance, a controller performing the identification in operation 952 does so by evaluating the current and/or previous application workloads to determine which processes have been performed, e.g., such as P/E cycles and intervals corresponding thereto.

From operation 952, method 950 proceeds to decision 954 which includes determining whether the frequency of P/E cycles is in a predetermined range of P/E cycle frequencies. Method 950 is preferably able to account for temporary effects that may result in a high increase of RBER that appears occasionally with low probability and typically disappears after the block has been erased. Thus, the predetermined P/E cycle frequency range preferably incorporates numbers of P/E cycle counts. According to one example, which is in not intended to limit the invention, the predetermined P/E cycle count range spans from zero P/E cycles to about 500 P/E cycles in a specific amount of time, but could be higher or lower depending on the desired approach. Moreover, the P/E cycle frequency range may be predetermined by a user, by a memory manufacturer, based on industry standards, etc.

In response to determining that the frequency of P/E cycles is in the predetermined frequency range, method 950 proceeds from decision 954 to operation 908 which includes advancing to a next (e.g., subsequent or second) block, e.g., as described above. However, in response to determining that the frequency of P/E cycles is not in a predetermined frequency range, the flowchart in FIG. 9B proceeds to operation 910 from decision 954. There, operation 910 includes decrementing the reliability counter corresponding to each respective page region of the given block. In other words, in response to determining that the given block has experienced desirable performance for a sufficiently long period of time, the reliability counter of the given block may be decremented, e.g., as described above.

It follows that the progression of method 950 differs from that of method 900 in that the processes included in FIG. 9B are performed based on a number of P/E cycles which have occurred, and decrements the corresponding reliability counter even in situations where no error event occurred.

Figure 10:
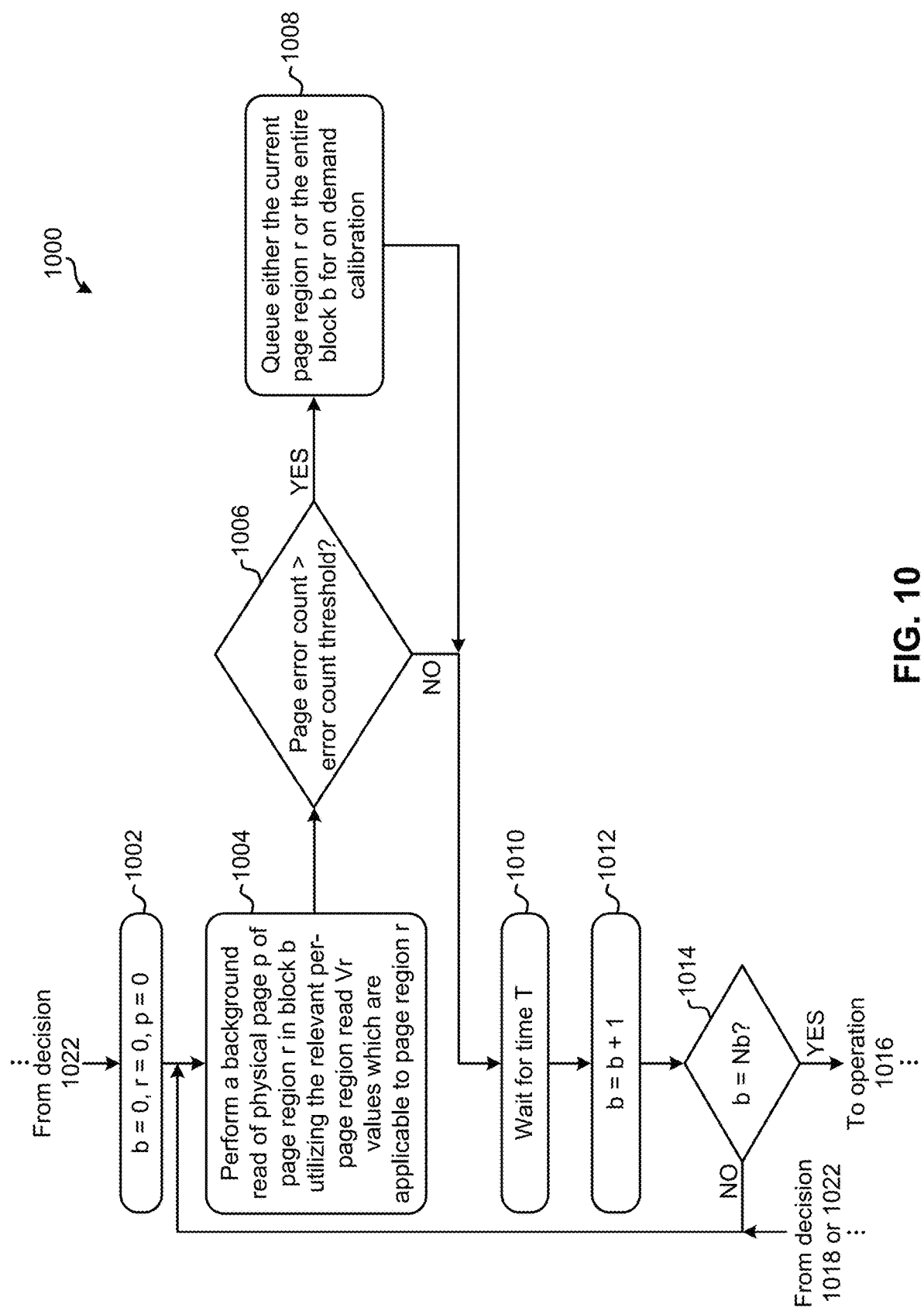
FIG. 10 is a flowchart of a method, in accordance with one embodiment.
Figure 10:
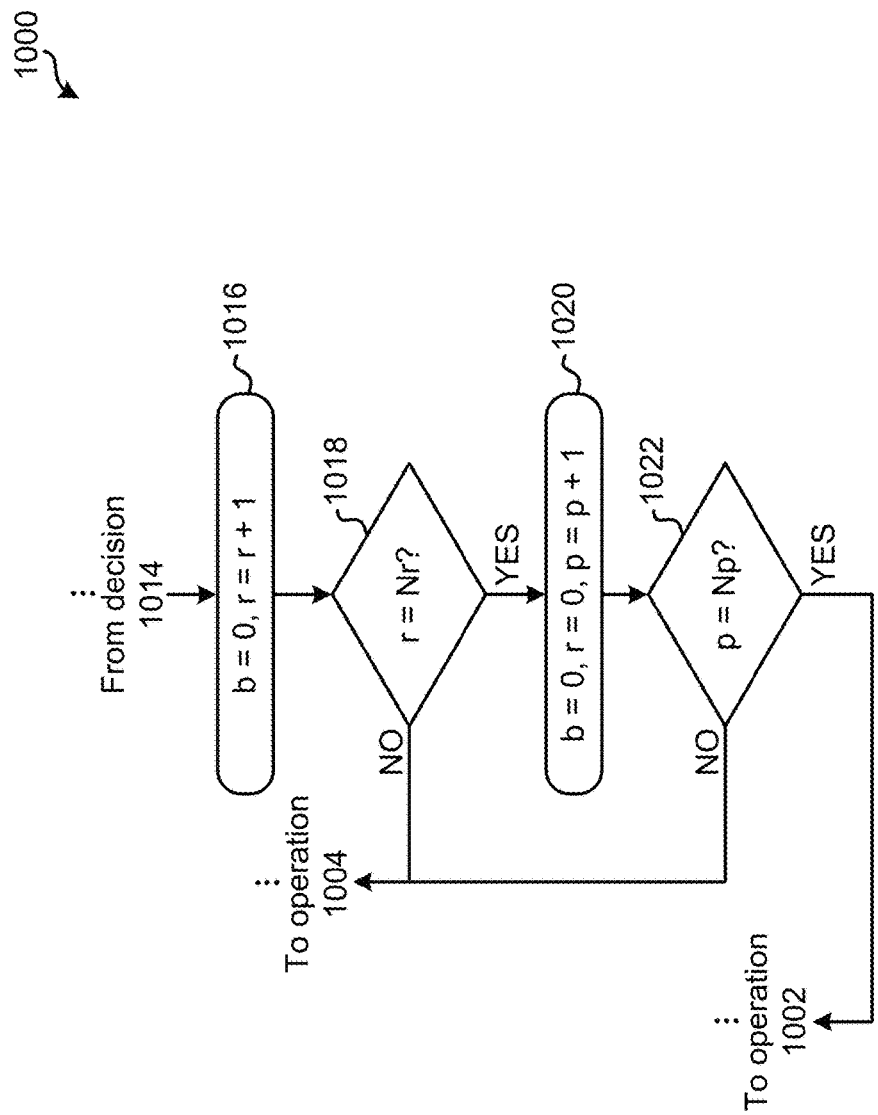

Looking now to FIG. 10, a method 1000 for advancing between pages of storage space in memory according to a specific interleaved order which ensures a reduced amount of delay time experienced between accessing various pages is illustrated in accordance with one embodiment. The method 1000 may be performed in accordance with the present invention in any of the environments depicted in FIGS. 1-9, among others, in various embodiments. For instance, any of the processes included in method 1000 may be performed with respect to blocks of storage space in 3-D TLC NAND Flash, 3-D QLC NAND Flash, 2-D NAND Flash, etc., or any other desired type of memory. Furthermore, more or less operations than those specifically described in FIG. 10 may be included in method 1000, as would be understood by one of skill in the art upon reading the present descriptions.

Each of the steps of the method 1000 may be performed by any suitable component of the operating environment. For example, in various embodiments, the method 1000 may be partially or entirely performed by a controller (e.g., Flash controller), a processor, a computer, etc., or some other device having one or more processors therein. Thus, in some embodiments, method 1000 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module (s) implemented in hardware and/or software, and preferably having at least one hardware component may be utilized in any device to perform one or more steps of the method 1000. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 10, operation 1002 of method 1000 includes initializing three process variables, "b", "r", and "p", which respectively specify indices for a block among the "Nb" blocks which include valid data, a page region among the "Nr" page regions in each block, and a physical page among the "Np" physical pages in each page region. The values of the block and physical page indices need not match the block identifier (ID) and physical page IDs utilized by the controller. Method 1000 proceeds from operation 1002 to operation 1004 which includes performing a background read of physical page p of page region r in block b utilizing the relevant per-page region read Vr values which are applicable to page region r. In preferred approaches, all physical pages in the page region are of the same type (e.g., lower pages, upper pages, extra pages, etc.), and therefore the background read is able to use the same read voltages when reading all physical pages in the page region.

In preferred approaches, this background read operation serves as a background mitigation read in that it temporarily restores the physical pages in block b from an increased RBER state to a reduced RBER state, e.g., as would be appreciated by one skilled in the art after reading the present description. As part of performing the background read of physical page p, the controller also detects the error count for physical page p, which may be used by a background health checker to update one or more block health metrics for block b.

Referring still to FIG. 10, decision 1006 includes determining whether the error count observed for page p in the background read performed at operation 1004 exceeds an error count threshold. The error count threshold may be individually determined for each block and may be adapted by the controller according to the operating conditions of the block, e.g., P/E cycle count, read disturb, data retention, etc. In response to determining that the error count observed for page p does not exceed the error count threshold, the process passes from decision 1006 to operation 1010, which will be described in further detail below. However, in response to determining that the error count observed for page p does exceed the error count threshold, method 1000 advances to operation 1008. There, operation 1008 includes queuing either the current page region r or the entire block b for on demand calibration of the relevant read threshold voltages. As will be appreciated by one skilled in the art after reading the present description, this on-demand calibration can be utilized to complement and provide a more immediate calibration than that provided by a regular periodic calibration of each block.

From operation 1008, method 1000 proceeds to operation 1010 where a wait time "T" is applied prior to performing a subsequent background read. In some approaches, time T can be defined according to device characteristics, the number of blocks managed by the controller, the number of blocks storing valid data, and other system requirements. For example, time T can be defined such that T*Nb=3 minutes. Because time T determines the cycle time for background reads to each block, the illustrated method ensures that each block holding valid data is read at least every T*Nb minutes, each page region is read every T*Nb*Nr minutes, and each physical page is read every T*Nb*Nr*Np minutes.

Proceeding to operation 1012, block index b is incremented, and decision 1014 subsequently determines whether block index b is equal to Nb. In situations where block index b is equal to Nb, is can be deduced that a background read has been performed on all Nb blocks which are holding valid data. Accordingly, in response to determining that b is not equal to Nb, method 1000 returns to operation 1004 such that a subsequent page may be read. However, method 1000 proceeds to operation 1016 in response to determining that block index b is equal to Nb. There, operation 1016 includes resetting block index b to 0 and advances page region r to a next page region as shown.

Decision 1018 further includes determining whether the new page region r is equal to Nr. Situations in which the new page region r is equal to Nr signify that a background read operation has been made to each page region in all blocks holding valid data. Accordingly, method 1000 returns to operation 1004 in response to determining that the new page region r is not equal to Nr. However, in response to determining that the new page region r is equal to Nr, method 1000 proceeds to operation 1020. There, operation 1020 includes resetting block index b and page region r to 0 and advances page index p.

Thereafter, method 1000 includes determining whether page index p is equal to Np. See decision 1022. In response to determining that page index p is not equal to Np, the flowchart returns to operation 1004 as described above. However, in response to determining that page index p is equal to Np, it may be concluded that that a background read operation has been made to each page in each page region in all blocks holding valid data. Accordingly, the iterative process has effectively completed a full cycle through all physical pages of the valid blocks which are accessible. Accordingly, method 1000 returns to operation 1002, e.g., such that a subsequent cycle may be initiated.

Figure 11:
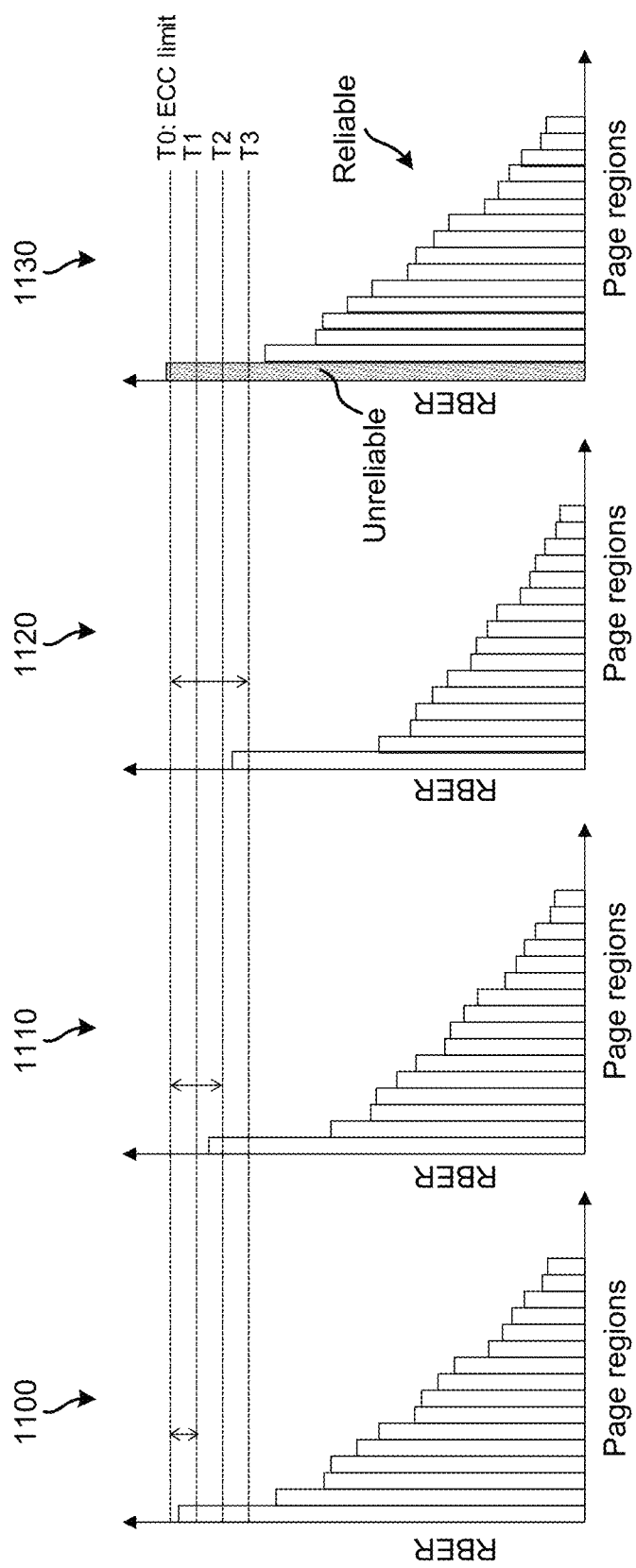
FIGS. 11A-11D are representational views of graphs which plot RBERs vs. page regions, in accordance with one embodiment.

Looking now to FIGS. 11A-11C, the improvements achieved by various ones of the approaches included herein are illustrated in accordance with an exemplary embodiment, which is in no way intended to limit the invention. It should be noted that for the sake of illustration, it has been assumed that after the first or second calibration procedures, the sorted indices of the page regions oriented along the x-axis remain the same. In other words, the "$k^{th}$" sorted index corresponds to the same physical page region in each of the graphs 1100, 1110, 1120, 1130 of FIGS. 11A-11C, respectively.

Referring specifically to FIG. 11A, the graph 1100 illustrates the RBERs experienced by a number of different page regions, where each column in the bar graph 1100 represents a distinct page region in memory. As shown, a highest RBER experienced by one of the page regions is undesirably high, e.g., in comparison to the ECC limit T0. In other words, the highest experienced RBER was determined as being above the first predetermined range T1 (e.g., see decision 606 of FIG. 6A). Accordingly, a first calibration procedure is preferably performed on the various page regions represented in FIG. 11A.

FIG. 11B illustrates the updated RBERs experienced by the same page regions illustrated in FIG. 11A as a result of the first calibration procedure. Although the RBER experienced by each of the respective page regions has been reduced, the highest RBER value is still undesirably high with respect to the second predetermined range T2. Accordingly, a second calibration procedure is performed on the various page regions represented in FIG. 11B.

FIG. 11C illustrates the updated RBERs experienced by the same page regions illustrated in FIG. 11B as a result of the second calibration procedure, but again the highest RBER value is still undesirably high with respect to the third predetermined range T3. Accordingly, the left-most page region is marked as unreliable in graph 1130 of FIG. 11D, while a remainder of the page regions each experience a sufficiently low RBER to remain reliable.

It follows that various ones of the embodiments included herein are able to detect and manage unreliable pages in NAND blocks, thereby improving data storage performance despite experiencing pages with high RBERs that cannot be improved by read voltage calibration. By applying a set of threshold criteria to promote additional calibration procedures, and marking specific pages and/or groups of pages as unreliable, the approaches included herein are able maintain efficient memory utilization and desirable RBER levels. It should also be noted that although the embodiments included herein have been described with respect to applying a first and/or second calibration procedure, additional calibration procedures may be implemented. For instance, a third calibration procedure, a fourth calibration procedure, fifth calibration procedure, etc., may be implemented in approaches where additional Vr calibration is desired. Moreover, applying a reliability counter allows for some of the approaches herein to account for both permanent and transient memory effects that may otherwise result in high RBERs.

These improvements are particularly desirable in comparison to the aforementioned shortcomings experienced by conventional processes. Again, various ones of the embodiments included herein prevent the excessive consumption of internal bandwidth by avoiding the performance of unnecessary calibration operations for certain blocks without increasing the risk of experiencing an uncorrectable read error as a result. Specifically, some of the embodiments described herein are able to accurately detect and manage unreliable pages of storage space in NVRAM. In other words, some of the embodiments included herein are able to distinguish between pages which are experiencing permanent errors and therefore cannot be improved by read voltage calibration and pages which are experiencing transient effects of limited data retention performance. In different approaches, this identification is made by implementing multiple different calibration procedures which are collectively able to determine whether each page (or group of pages) is experiencing a permanent error and therefore whether each page is reliable or not. As a result, the number of unnecessary block calibrations performed is significantly reduced, while also maintaining efficient memory utilization and desirable RBER levels.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 12:
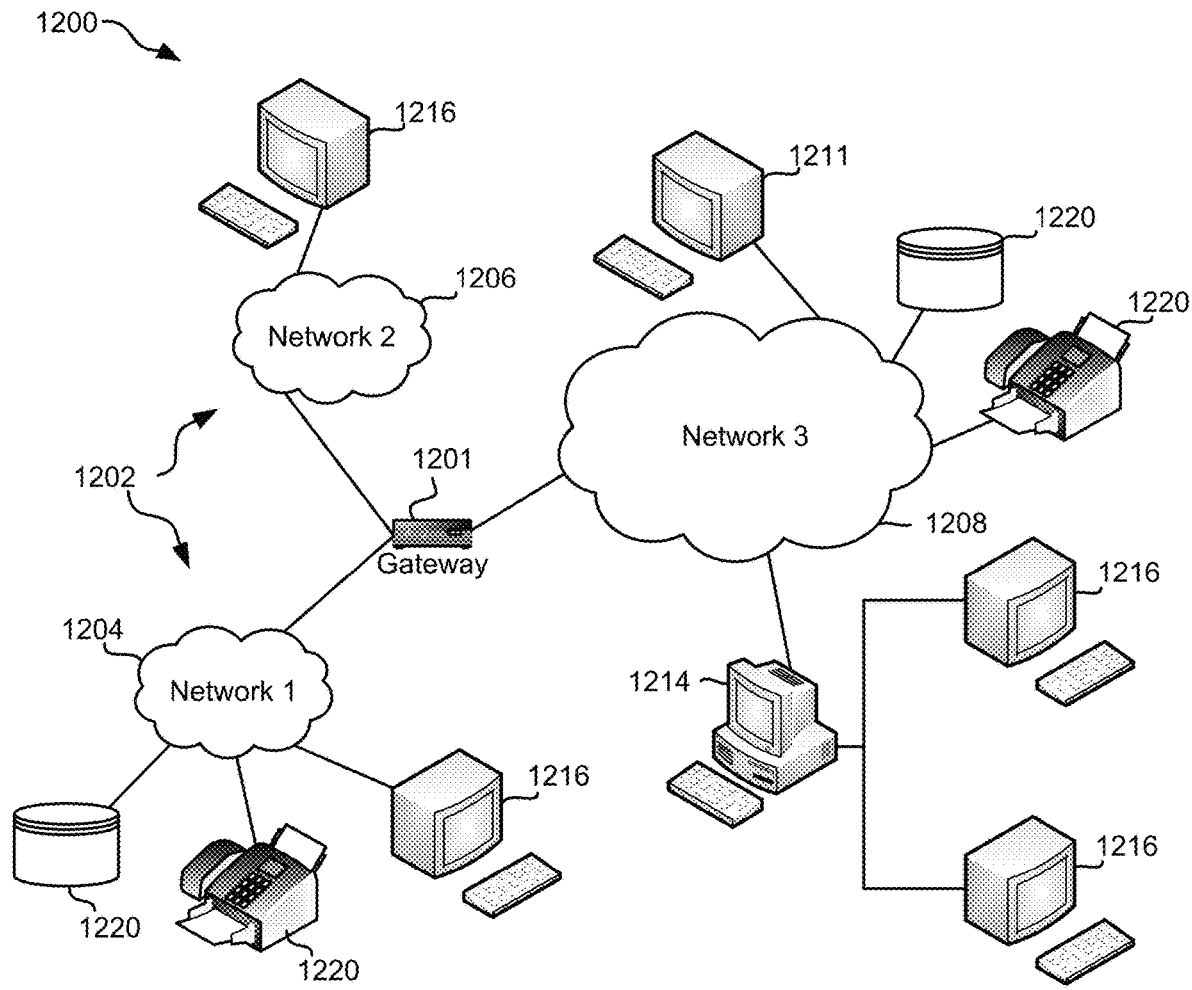
FIG. 12 is a network architecture, in accordance with one embodiment.

FIG. 12 illustrates a network architecture 1200, in accordance with one embodiment. As shown in FIG. 12, a plurality of remote networks 1202 are provided including a first remote network 1204 and a second remote network 1206. A gateway 1201 may be coupled between the remote networks 1202 and a proximate network 1208. In the context of the present network architecture 1200, the networks 1204, 1206 may each take any form including, but not limited to a LAN, a WAN such as the Internet, public switched telephone network (PSTN), internal telephone network, etc.

In use, the gateway 1201 serves as an entrance point from the remote networks 1202 to the proximate network 1208. As such, the gateway 1201 may function as a router, which is capable of directing a given packet of data that arrives at the gateway 1201, and a switch, which furnishes the actual path in and out of the gateway 1201 for a given packet.

Further included is at least one data server 1214 coupled to the proximate network 1208, and which is accessible from the remote networks 1202 via the gateway 1201. It should be noted that the data server(s) 1214 may include any type of computing device/groupware. Coupled to each data server 1214 is a plurality of user devices 1216. Such user devices 1216 may include a desktop computer, laptop computer, handheld computer, printer, and/or any other type of logic-containing device. It should be noted that a user device 1211 may also be directly coupled to any of the networks, in some embodiments.

A peripheral 1220 or series of peripherals 1220, e.g., facsimile machines, printers, scanners, hard disk drives, networked and/or local data storage units or systems, etc., may be coupled to one or more of the networks 1204, 1206, 1208. It should be noted that databases and/or additional components may be utilized with, or integrated into, any type of network element coupled to the networks 1204, 1206, 1208. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 1204, 1206, 1208, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 13:
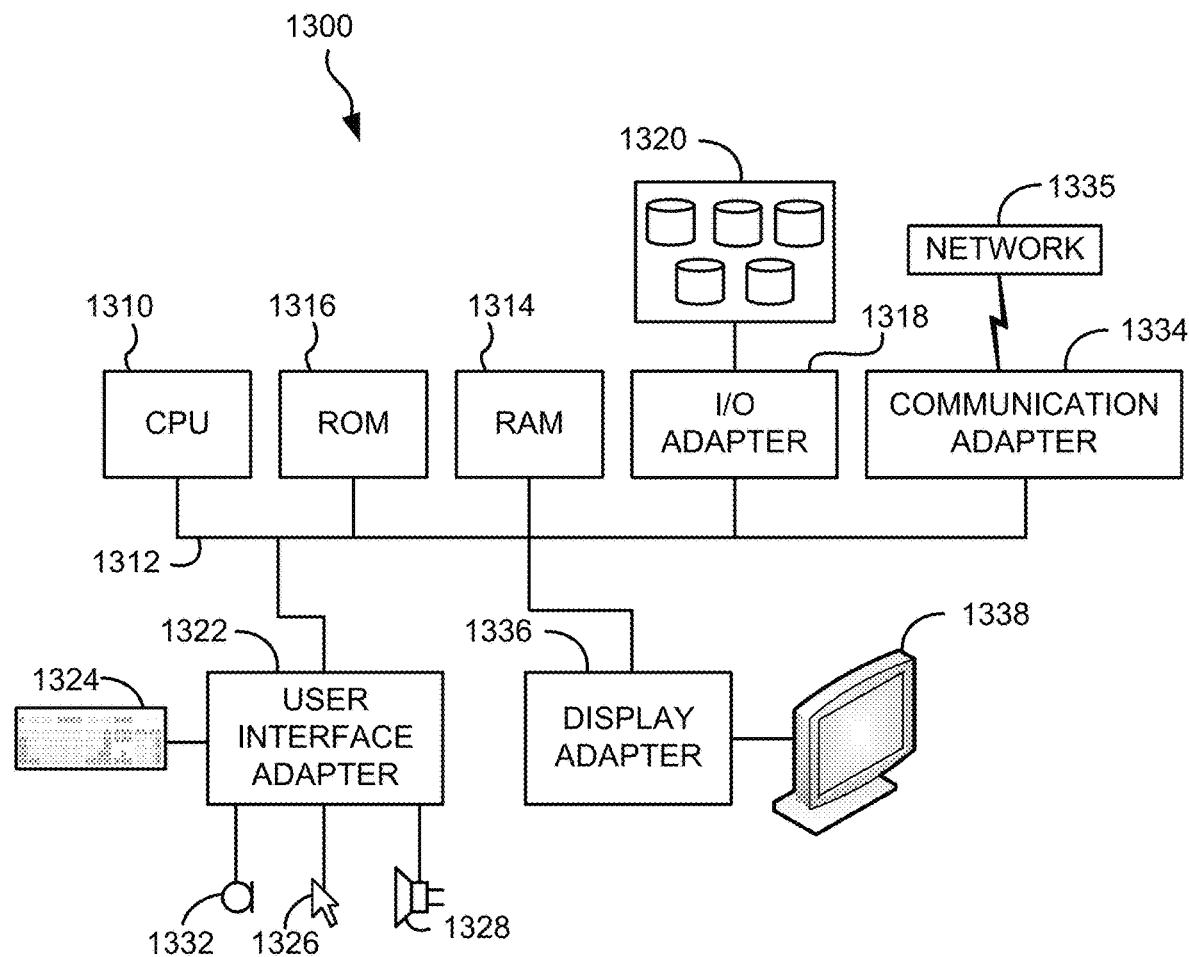
FIG. 13 is a representative hardware environment that may be associated with the servers and/or clients of FIG. 12, in accordance with one embodiment.

FIG. 13 shows a representative hardware environment associated with a user device 1216 and/or server 1214 of FIG. 12, in accordance with one embodiment. FIG. 13 illustrates a typical hardware configuration of a processor system 1300 having a central processing unit 1310, such as a microprocessor, and a number of other units interconnected via a system bus 1312, according to one embodiment. In some embodiments, central processing unit 1310 may include any of the approaches described above with reference to the one or more processors 210 of FIG. 2.

The processor system 1300 shown in FIG. 13 includes a Random Access Memory (RAM) 1314, Read Only Memory (ROM) 1316, and an I/O adapter 1318. According to some embodiments, which are in no way intended to limit the invention, I/O adapter 1318 may include any of the approaches described above with reference to I/O adapter 218 of FIG. 2. Referring still to processor system 1300 of FIG. 13, the aforementioned components 1314, 1316, 1318 may be used for connecting peripheral devices such as storage subsystem 1320 to the bus 1312. In some embodiments, storage subsystem 1320 may include a similar and/or the same configuration as data storage system 220 of FIG. 2. According to an example, which is in no way intended to limit the invention, storage subsystem 1320 may include non-volatile data storage cards, e.g., having NVRAM memory cards, RAM, ROM, and/or some other known type of non-volatile memory, in addition to RAID controllers as illustrated in FIG. 2.

With continued reference to FIG. 13, a user interface adapter 1322 for connecting a keyboard 1324, a mouse 1326, a speaker 1328, a microphone 1332, and/or other user interface devices such as a touch screen, a digital camera (not shown), etc., to the bus 1312.

Processor system 1300 further includes a communication adapter 1334 which connects the processor system 1300 to a communication network 1335 (e.g., a data processing network) and a display adapter 1336 which connects the bus 1312 to a display device 1338.

The processor system 1300 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 14:
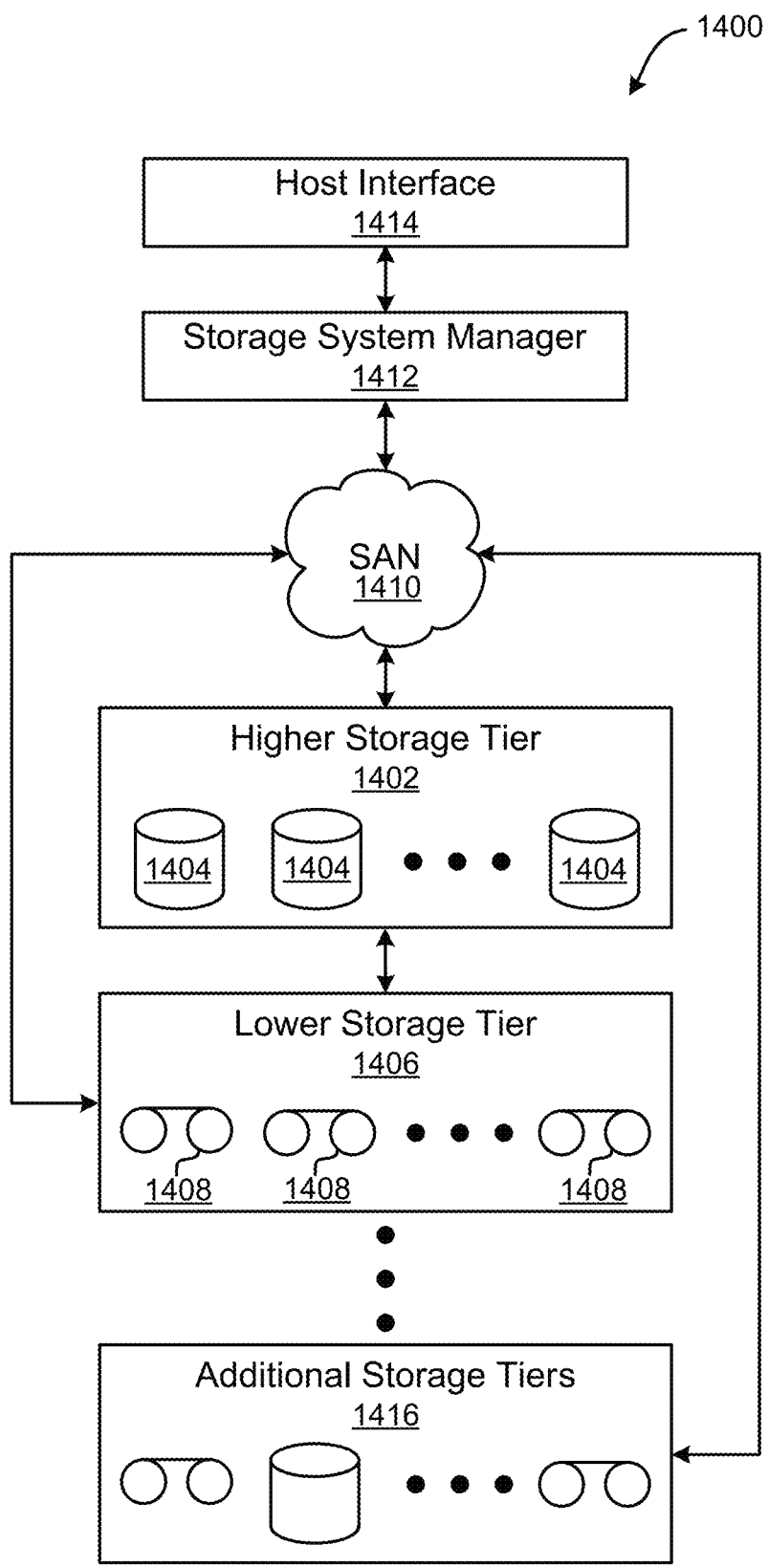
FIG. 14 is a tiered data storage system in accordance with one embodiment.

Moreover, FIG. 14 illustrates a storage system 1400 which implements high level (e.g., SSD) storage tiers in combination with lower level (e.g., magnetic tape) storage tiers, according to one embodiment. Note that some of the elements shown in FIG. 14 may be implemented as hardware and/or software, according to various embodiments. The storage system 1400 may include a storage system manager 1412 for communicating with a plurality of media on at least one higher storage tier 1402 and at least one lower storage tier 1406. However, in other approaches, a storage system manager 1412 may communicate with a plurality of media on at least one higher storage tier 1402, but no lower storage tier. The higher storage tier(s) 1402 preferably may include one or more random access and/or direct access media 1404, such as hard disks, nonvolatile memory (NVM), NVRAM), solid state memory in SSDs, flash memory, SSD arrays, flash memory arrays, etc., and/or others noted herein or known in the art. According to illustrative examples, FIGS. 3-4 show exemplary architectures of SSD systems which may be used as a higher storage tier 1402 depending on the desired embodiment.

Referring still to FIG. 14, the lower storage tier(s) 1406 preferably includes one or more lower performing storage media 1408, including sequential access media such as magnetic tape in tape drives and/or optical media, slower accessing HDDs, slower accessing SSDs, etc., and/or others noted herein or known in the art. One or more additional storage tiers 1416 may include any combination of storage memory media as desired by a designer of the system 1400. Thus, the one or more additional storage tiers 1416 may, in some approaches, include a SSD system architecture similar or the same as those illustrated in FIGS. 1-2. Also, any of the higher storage tiers 1402 and/or the lower storage tiers 1406 may include any combination of storage devices and/or storage media.

The storage system manager 1412 may communicate with the storage media 1404, 1408 on the higher storage tier(s) 1402 and lower storage tier(s) 1406 through a network 1410, such as a storage area network (SAN), as shown in FIG. 14, or some other suitable network type. The storage system manager 1412 may also communicate with one or more host systems (not shown) through a host interface 1414, which may or may not be a part of the storage system manager 1412. The storage system manager 1412 and/or any other component of the storage system 1400 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1400 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1402, may include a majority of SSD storage media for storing data in a higher performing storage environment, and remaining storage tiers, including lower storage tier 1406 and additional storage tiers 1416 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1402, while data not having one of these attributes may be stored to the additional storage tiers 1416, including lower storage tier 1406. Of course, one of skill in the art, upon reading the present descriptions, may devise many other combinations of storage media types to implement into different storage schemes, according to the embodiments presented herein.

According to some embodiments, the storage system (such as 1400) may include logic configured to receive a request to open a data set, logic configured to determine if the requested data set is stored to a lower storage tier 1406 of a tiered data storage system 1400 in multiple associated portions, logic configured to move each associated portion of the requested data set to a higher storage tier 1402 of the tiered data storage system 1400, and logic configured to assemble the requested data set on the higher storage tier 1402 of the tiered data storage system 1400 from the associated portions.

Of course, this logic may be implemented as a method on any device and/or system or as a computer program product, according to various embodiments.

What is claimed is:
1. A computer-implemented method, comprising:
performing a first read of one or more pages in a first page region of a first block of storage space in memory;
determining whether a highest raw bit error rate (RBER) experienced during the first read is in a first predetermined range;
in response to determining that the highest RBER experienced during the first read is not in the first predetermined range, performing a first calibration procedure on the one or more pages in the first page region of the first block;
performing a second read of the one or more pages in the first page region of the first block that were calibrated using the first calibration procedure;
determining whether a highest RBER experienced during the second read is in a second predetermined range;
in response to determining that the highest RBER experienced during the second read is not in the second predetermined range, performing a second calibration procedure on the one or more pages in the first page region of the first block;
performing a third read of the one or more pages in the first page region of the first block that were calibrated using the second calibration procedure;
determining whether a highest RBER experienced during the third read is in a third predetermined range;
in response to determining that the highest RBER experienced during the third read is not in the second predetermined range, incrementing a reliability counter which corresponds to the first page region of the first block;
determining whether the reliability counter which corresponds to the first page region of the first block is in a first predetermined reliability range; and
in response to determining that the reliability counter which corresponds to the first page region of the first block is not in a first predetermined reliability range, marking the first page region of the first block as unreliable.

2. The computer-implemented method of claim 1, wherein the operations are repeated in an iterative fashion for each page region in each block of storage space in the memory.

3. The computer-implemented method of claim 1, comprising:
determining whether an amount of the first block that has been marked as unreliable is in a second predetermined reliability range; and
in response to determining that the amount of the first block that has been marked as unreliable is not in the second predetermined reliability range, marking the first block as unreliable.

4. The computer-implemented method of claim 3, comprising:
converting the unreliable first block to single level cell mode.

5. The computer-implemented method of claim 3, comprising:
retiring the unreliable first block.

6. The computer-implemented method of claim 1, wherein performing the first calibration procedure consumes a smaller amount of time than an amount of time consumed performing the second calibration procedure.

7. The computer-implemented method of claim 1, comprising:
performing an inspection procedure for each block of storage space in the memory in an iterative fashion, wherein the inspection procedure includes:
identifying a frequency of program/erase (P/E) cycle intervals performed;
determining whether the frequency of P/E cycles is in a predetermined range of P/E cycle frequencies; and
in response to determining that the frequency of P/E cycles is in the predetermined range of P/E cycle frequencies, decrementing a reliability counter corresponding to each respective page region of the given block.

8. The computer-implemented method of claim 1, wherein the memory includes three-dimensional triple-level-cell NAND Flash and/or three-dimensional quad-level-cell NAND Flash.

9. A computer program product comprising a computer readable storage medium having program instructions embodied therewith, the program instructions readable and/or executable by a processor to cause the processor to:
  perform, by the processor, a first read of one or more pages in a first page region of a first block of storage space in memory;
  determine, by the processor, whether a highest raw bit error rate (RB ER) experienced during the first read is in a first predetermined range;
  in response to determining that the highest RBER experienced during the first read is not in the first predetermined range, perform, by the processor, a first calibration procedure on the one or more pages in the first page region of the first block;
  perform, by the processor, a second read of the one or more pages in the first page region of the first block that were calibrated using the first calibration procedure;
  determine, by the processor, whether a highest RBER experienced during the second read is in a second predetermined range;
  in response to determining that the highest RBER experienced during the second read is not in the second predetermined range, perform, by the processor, a second calibration procedure on the one or more pages in the first page region of the first block;
  perform, by the processor, a third read of the one or more pages in the first page region of the first block that were calibrated using the second calibration procedure;
  determine, by the processor, whether a highest RBER experienced during the third read is in a third predetermined range;
  in response to determining that the highest RBER experienced during the third read is not in the third predetermined range, increment, by the processor, a reliability counter which corresponds to the first page region of the first block;
  determine, by the processor, whether the reliability counter which corresponds to the first page region of the first block is in a first predetermined reliability range; and
  in response to determining that the reliability counter which corresponds to the first page region of the first block is not in a first predetermined reliability range, mark, by the processor, the first page region of the first block as unreliable.

10. The computer program product of claim 9, wherein the operations are repeated in an iterative fashion for each page region in each block of storage space in the memory.

11. The computer program product of claim 9, the program instructions readable and/or executable by the processor to cause the processor to:
  determine, by the processor, whether an amount of the first block that has been marked as unreliable is in a second predetermined reliability range; and
  in response to determining that the amount of the first block that has been marked as unreliable is not in the second predetermined reliability range, mark, by the processor, the first block as unreliable.

12. The computer program product of claim 11, the program instructions readable and/or executable by the processor to cause the processor to:
  convert, by the processor, the unreliable first block to single level cell mode.

13. The computer program product of claim 11, the program instructions readable and/or executable by the processor to cause the processor to:
  retire, by the processor, the unreliable first block.

14. The computer program product of claim 9, wherein performing the first calibration procedure consumes a smaller amount of time than an amount of time consumed performing the second calibration procedure.

15. The computer program product of claim 9, the program instructions readable and/or executable by the processor to cause the processor to:
  perform, by the processor, an inspection procedure for each block of storage space in the memory in an iterative fashion, wherein the inspection procedure includes:
    identifying a frequency of program/erase (P/E) cycle intervals performed;
    determining whether the frequency of P/E cycles is in a predetermined range of P/E cycle frequencies; and
    in response to determining that the frequency of P/E cycles is in the predetermined range of P/E cycle frequencies, decrementing a reliability counter corresponding to each respective page region of the given block.

16. The computer program product of claim 9, the program instructions readable and/or executable by the processor to cause the processor to:
  determine, by the processor, whether performing the second calibration procedure is possible,
  wherein the second calibration procedure is performed on the one or more pages in the first page region of the first block in response to determining that the highest RBER experienced during the second read is not in the second predetermined range, and in response to determining that performing the second calibration procedure is possible,
  wherein the memory includes three-dimensional triple-level cell NAND Flash and/or three-dimensional quad-level-cell NAND Flash.

17. A system, comprising:
  a processor; and
  logic integrated with and/or executable by the processor, the logic being configured to:
  perform, by the processor, a first read of one or more pages in a first page region of a first block of storage space in memory;
  determine, by the processor, whether a highest raw bit error rate (RB ER) experienced during the first read is in a first predetermined range;
  in response to determining that the highest RBER experienced during the first read is not in the first predetermined range, perform, by the processor, a first calibration procedure on the one or more pages in the first page region of the first block;
  perform, by the processor, a second read of the one or more pages in the first page region of the first block that were calibrated using the first calibration procedure;
  determine, by the processor, whether a highest RBER experienced during the second read is in a second predetermined range;
  in response to determining that the highest RBER experienced during the second read is not in the second predetermined range, perform, by the processor, a second calibration procedure on the one or more pages in the first page region of the first block;

perform, by the processor, a third read of the one or more pages in the first page region of the first block that were calibrated using the second calibration procedure;

determine, by the processor, whether a highest RBER experienced during the third read is in a third predetermined range;

in response to determining that the highest RBER experienced during the third read is not in the third predetermined range, increment, by the processor, a reliability counter which corresponds to the first page region of the first block;

determine, by the processor, whether the reliability counter which corresponds to the first page region of the first block is in a first predetermined reliability range; and in response to determining that the reliability counter which corresponds to the first page region of the first block is not in a first predetermined reliability range, mark, by the processor, the first page region of the first block as unreliable.

18. The system of claim 17, the logic being configured to:

determine, by the processor, whether an amount of the first block that has been marked as unreliable is in a second predetermined reliability range;

in response to determining that the amount of the first block that has been marked as unreliable is not in the second predetermined reliability range, mark, by the processor, the first block as unreliable; and retire, by the processor, the unreliable first block.

* * * * *